United States Patent [19]

Kimbara et al.

[11] Patent Number: 5,426,849
[45] Date of Patent: Jun. 27, 1995

[54] METHOD OF PRODUCING A POLYIMIDE MULTILAYER WIRING BOARD

[75] Inventors: Kohji Kimbara; Shinichi Hasegawa; Hisashi Ishida, all of Tokyo, Japan

[73] Assignee: NEC Corporation, Tokyo, Japan

[21] Appl. No.: 70,923

[22] Filed: Jul. 28, 1993

Related U.S. Application Data

[62] Division of Ser. No. 818,529, Jan. 9, 1992, Pat. No. 5,321,210.

[30] Foreign Application Priority Data

| Jan. 9, 1991 | [JP] | Japan | 3-011704 |
| Jan. 9, 1991 | [JP] | Japan | 3-011705 |
| Jul. 26, 1991 | [JP] | Japan | 3-208793 |
| Nov. 18, 1991 | [JP] | Japan | 3-301430 |
| Nov. 20, 1991 | [JP] | Japan | 3-304755 |
| Nov. 21, 1991 | [JP] | Japan | 3-305943 |

[51] Int. Cl.[6] .................. H01R 9/09; H05K 3/36
[52] U.S. Cl. .................. 29/830; 29/843; 156/182; 156/230; 156/247; 156/249
[58] Field of Search ............. 29/830, 842, 843, 852, 29/853, 846, 848; 156/60, 182, 230, 247, 249, 633-634; 174/256-259, 261-264

[56] References Cited

U.S. PATENT DOCUMENTS

| 3,795,047 | 3/1974 | Abolafia et al. . |
| 4,588,642 | 5/1986 | Ochiumi . |
| 4,666,254 | 5/1987 | Itoh et al. . |
| 4,700,276 | 10/1987 | Freyman et al. . |
| 4,812,191 | 3/1989 | Ho et al. . |
| 4,827,083 | 5/1989 | Inasaka et al. . |
| 4,882,454 | 11/1989 | Peterson et al. . |
| 4,950,625 | 8/1990 | Dishon . |
| 5,001,542 | 3/1991 | Tsukagoshi et al. . |

FOREIGN PATENT DOCUMENTS

| 0332889 | 9/1989 | European Pat. Off. . |
| 0379736 | 8/1990 | European Pat. Off. . |

OTHER PUBLICATIONS

Japanese Patent Abstract (JP-a-02 012 990), vol. 14, No. 154, (E-907), Jan. 17, 1990 Appln. No. 63-163771 filed Jun. 30, 1988 entitled "Multilayer Printed Circuit Board".

*Primary Examiner*—Adrienne Johnstone
*Attorney, Agent, or Firm*—Sughrue, Mion, Zinn, Macpeak & Seas

[57] ABSTRACT

A polyimide multilayer wiring board is constructed by using a plurality of laminated blocks each of which has a plurality of wiring layers and interlaminar insulating layers of polyimide. On a base block having a substrate, the other blocks are laid on top of another, bonded to each other with a polyimide used in each block or another adhesive and electrically connected to each other by using, for example, metal bumps formed on each block. Each of the blocks except the base block is formed on a temporary substrate, and the temporary substrate is removed after bonding each block to the base block or precedingly bonded blocks. This multilayer wiring board can be produced in a shortened time with increased yield.

20 Claims, 27 Drawing Sheets

METHOD OF PRODUCING A POLYIMIDE MULTILAYER WIRING BOARD

This is a divisional of application No. 07/818,529 filed Jan. 9, 1992, now U.S. Pat. No. 5,321,210.

BACKGROUND OF THE INVENTION

This invention relates to a multilayer wiring board in which a plurality of wiring layers are laminated on a ceramic or hard resin substrate by using polyimide resin as the interlaminar insulating material and a method of producing same. The multilayer wiring board is suitable for mounting thereon LSI chips.

Multilayer printed wiring boards have been long used as wiring boards for mounting thereon LSI chips. Usually a multilayer printed wiring board is constructed by alternately laminating copper cladded core boards and prepreg sheets, uniting the laminated components by hot pressing to cause the prepreg sheets to function as adhesive, drilling a plurality of through-holes in the united multilayer board and plating the inner surfaces defining the respective through-holes with copper to make interlaminar electrical connections between the core boards.

In the conventional multilayer printed wiring boards the wiring density is restricted by the drilling of the through-holes. It is impossible to extremely reduce the diameter of the through-holes because of forming them by drilling, and hence there is a strict limitation to the number of wiring lines that can be formed in the area between the through-holes. Further, the capacity of each core board for signaling wiring lines becomes lower as the total number of the core boards is increased since the total number of the through-holes must be progressively increased as the number of the core boards increases.

Recently multilayer wiring boards of a different type have been developed to meet the demand for multilayer wiring boards which can be made higher in wiring density and can be used in large computers. A multilayer wiring board of the new type uses polyimide resin as the interlaminar insulating material to support a plurality of wiring layers on a ceramic substrate, and this multi-layer wiring board is produced by alternately repeating a process for forming a polyimide insulating layer and another process for forming a wiring layer. The former process includes applying a polyimide varnish to the substrate or a precedingly formed wiring layer, drying the varnish, forming via holes in the polyimide layer and then curing the polyimide. The latter process includes forming a wiring pattern by photolithography and then making wiring by vacuum evaporation or plating.

However, the above laminating process for producing the polyimide multilayer wiring board takes very long hours since the steps of applying a polyimide varnish, forming via holes and curing the polyimide need to be repeated the same number of times as the total number of the insulating layers. Besides, the repetition of the curing operation is liable to cause the precedingly cured polyimide to deteriorate under repeated thermal stress. Further, it is difficult to raise the yield of acceptable products since the laminating process is a sequential process.

To obviate the disadvantage of the sequential laminating process in respect of the yield of acceptable products there is another method of producing a polyimide multilayer wiring board by using a number of polyimide sheets on each of which a wiring pattern is formed in advance. On a ceramic substrate the polyimide sheets are laminated one after another each time by application of heat and pressure. By this method it is possible to select defectless sheets before the laminating operation, and hence it is possible to raise the yield of acceptable multilayer wiring boards. However, this method also has disadvantages that the laminating process takes long hours because of the need of repeating the heat pressing operation many times and that the polyimide of the bottom layers is liable to deteriorate by repeated thermal stress.

SUMMARY OF THE INVENTION

It is an object of the present invention to provide an improved polyimide multilayer wiring board which can be made high in wiring density and can be produced in a relatively short time and with high yield of good products.

It is another object of the invention to provide an advantageous method for producing the above stated improved polyimide multilayer wiring board.

The present invention provides a multilayer wiring board which comprises an electrically insulating substrate, a plurality of laminated blocks which are laid on top of another on the substrate and bonded to each other. Each of the laminated blocks comprises a plurality of wiring layers and a plurality of polyimide resin layers in an alternately laminated arrangement. The multilayer wiring board further comprises connection means for electrically connecting two adjacently positioned blocks to each other.

For example, the connection means is a combination of a plurality of solder pools in the surface of one of the two adjacently positioned blocks and a plurality of metal bumps on the surface of the other block.

Further, the invention provides a method of producing a multilayer wiring board, the method comprising the steps of (i) making a laminated base block which comprises an electrically insulating substrate, a combination of a plurality of wiring layers and a plurality of polyimide resin layers in an alternately laminated arrangement and a plurality of electrical terminals exposed in the surface opposite from the substrate, (ii) separately making a plurality of laminated temporary blocks each of which comprises a temporary substrate, a combination of a plurality of wiring layers and a plurality of polyimide resin layers in an alternately laminated arrangement and a plurality of electrical terminals exposed in the surface opposite from the temporary substrate, (iii) bonding one of the temporary blocks to the base block such that the electrical terminals of the temporary block come into alignment with the electrical terminals of the base block, respectively, and electrically connecting the terminals of the temporary block to the terminals of the base block, respectively, (iv) removing the temporary substrate, (v) providing a plurality of electrical terminals on the surface exposed by the removal of the temporary substrate, and (vii) bonding a second temporary block to the laminate obtained by the steps (iii) to (v) and electrically connecting the electrical terminals of the second temporary block to the electrical terminals provided at the step (v), and removing the temporary substrate of the second temporary substrate.

As will be apparent the above steps (vi) and (vii) can be repeated until an intended number of blocks are assembled into a multilayer wiring board.

The invention has advantages in many respects. First, compared with the conventional sequential laminating process the manufacturing process according to the invention is very higher in productivity and the multilayer wiring board can be produced in a greatly shortened time, firstly because a number of blocks can be produced simultaneously and also because in this invention it suffices to perform a heat press curing operation only at the stage of bonding each block to another block or precedingly bonded blocks. Second, deterioration of the polyimide layers by thermal stress is obviated since the number of times of heat press curing operation is greatly decreased. Further, the multilayer wiring board can be produced with improved accuracy since each block has a relatively small number of wiring layers and hence can be produced very accurately. Furthermore, in mass production the yield of acceptable products considerably increases because every block can be electrically inspected to exclude defective blocks before assembling the blocks into the multilayer wiring board.

DESCRIPTION OF THE PREFERRED EMBODIMENTS

Figure 1:
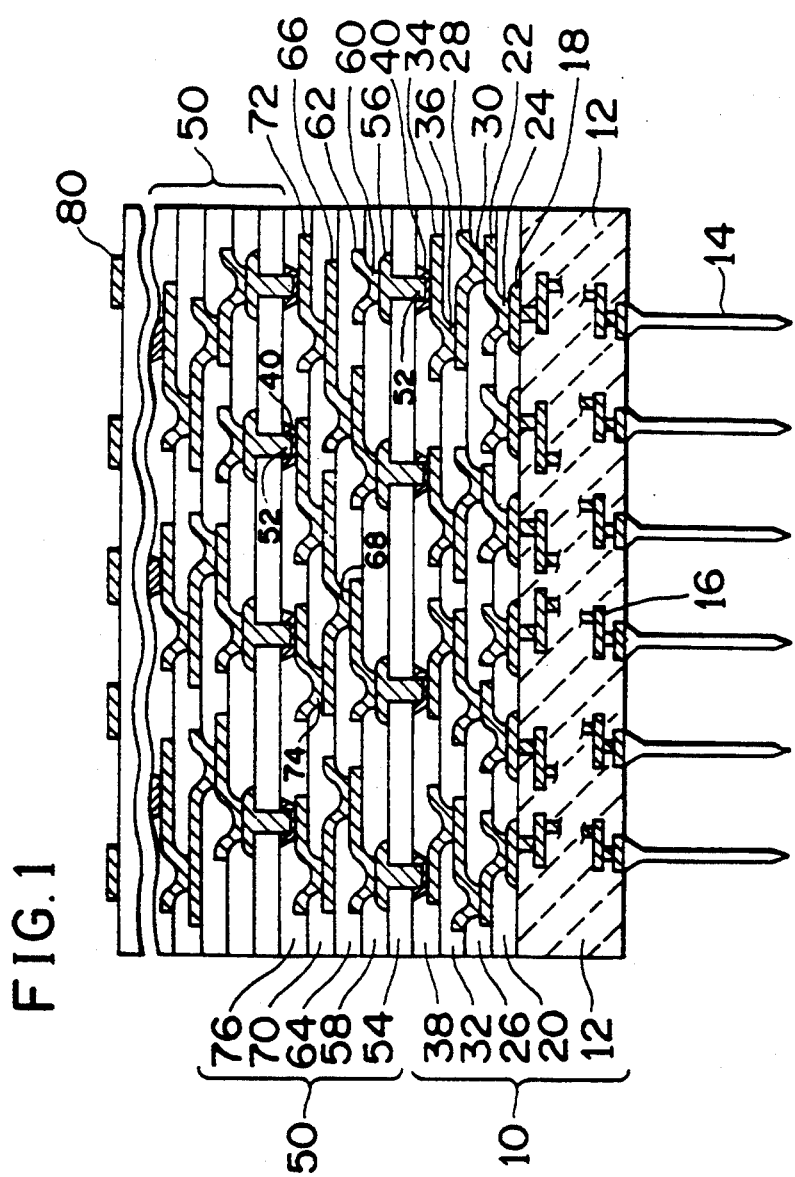
FIG. 1 is a schematic and elevational sectional view of a multilayer wiring board which embodies the invention and has a ceramic substrate.

FIG. 1 shows an example of multilayer wiring boards according to the invention. Fundamentally this multilayer wiring board is an assembly a base block 10 and a plurality of blocks 50 each of which is laid on top of another, and each of the blocks 10, 50 has a laminated structure.

The bottom layer of the base block 10 is a ceramic substrate 12. A plurality of input-output terminal pins 14 protrude from the bottom surface of the substrate 12, and interconnection wirings 16 are formed in the substrate 12 to provide conductive paths extending from the top surface of the substrate to the respective pins 14. For example, the substrate 12 is an alumina substrate using molybdenum as the wiring metal. The base block 10 has a layer of interconnecting and grounding wiring 18 on the top surface of the ceramic substrate 12, a layer of signaling wiring 22 spaced from the wiring layer 18 by a polyimide resin layer 20 (hereafter the term "polyimide" will be used in the sense of "polyimide resin"), another layer of signaling wiring 28 spaced from the wiring layer 22 by a polyimide layer 26, another layer of interconnecting and grounding wiring 34 spaced from the wiring 28 by a polyimide layer 32, and another polyimide layer 38 which provides the top surface of the block 10. The signaling wiring 22 and the signaling wiring 28 make a pair, and one of them is arranged in X-direction and the other in Y-direction. These two signaling wiring layers 22, 28 are positioned between the upper grounding wiring layer 34 and the lower grounding wiring layer 18 with care to adjust impedance and reduce crosstalk noise. In the polyimide layer 38 there are a plurality of solder pools 40 which are exposed in the top surface of the block 10 and connect with the wiring layer 34. Through each of the polyimide layers 20, 26 and 32, interlayer conductors 24, 30, 36 provide connections between the two wiring layers on the opposite sides of each polyimide layer. The interlayer conductors 24, 30, 36 are formed by using via holes as will be described hereinafter.

The block 50 placed on the base block 10 has a polyimide layer 54 as the bottom layer in contact with the top polyimide layer 38 of the base block 10, and a layer of interconnecting and grounding wiring 56 is formed on the top side of the polyimide layer 54. A plurality of metal bumps 52 protrude from the bottom surface of the polyimide layer 54 and respectively intrude into the solder pools 40 in the top surface of the base block 10. The metal bumps 52 extend through the polyimide layer 54 from the wiring layer 56. Further the block 50 has a layer of signaling wiring 62 spaced from the wiring layer 56 by a polyimide layer 58, another layer of signaling wiring 66 spaced from the wiring layer 58 by a polyimide layer 64, another layer of interconnecting and grounding wiring 72 spaced from the wiring layer 66 by a polyimide layer 70, and another polyimide layer 76 which is laid on the wiring layer 72 and provides the top surface of the block 50. In the polyimide layer 76 there are a plurality of solder pools 40 which are exposed in the top surface of the block 50 and connect with the wiring layer 72. Through each of the polyimide layers 58, 66 and 70 interlaminar conductors 60, 68, 74 provide connections between the two wiring layers on the opposite sides of each polyimide layer. The interlaminar conductors 60, 68, 74 are formed by using via holes as will be described hereinafter. The signaling wiring 62 and the signaling wiring 66 make a pair, and one of them is arranged in X-direction and the other in Y-direction. These two signaling wiring layers 62 and 66 are positioned between the upper grounding wiring layer 72 and the lower grounding layer 56 with care to adjust impedance and reduce crosstalk noise. This block 50 is fixed to the base block 10 by adhesion of the bottom polyimide layer 54 to the top polyimide layer 38 of the base block, and the block 50 is electrically connected to the base block 10 by solder jointing the metal bumps 52 with the corresponding solder pools 40 of the base block 10.

Each of the remaining blocks 50 has the above described laminar structure except that the block 50 at the top of the multilayer wiring board is formed with a plurality of electrode pads 80, instead of the solder pools 40 in the other blocks, for mounting LSI chips (not shown) thereon. Each block 50 is mechanically fixed to and electrically connected to the underlying block 50 similarly to the fixing and connection of the block 50 on the bottom side to the base block 10.

For example, in the multilayer wiring board of FIG. 1 each of the wiring layers is about 7 $\mu$m or 10 $\mu$m in thickness and about 25 $\mu$m in line width; each of the interlaminar insulating polyimide layers has a thickness of about 20 $\mu$m; each of the solder bumps 40 is about 50–500 $\mu$m square in area and about 10–100 $\mu$m in depth; and each of the metal bumps 52 is about 25–300 $\mu$m square in cross section and about 10–50 $\mu$m in the length of protrusion from the polyimide surface.

Figure 2:
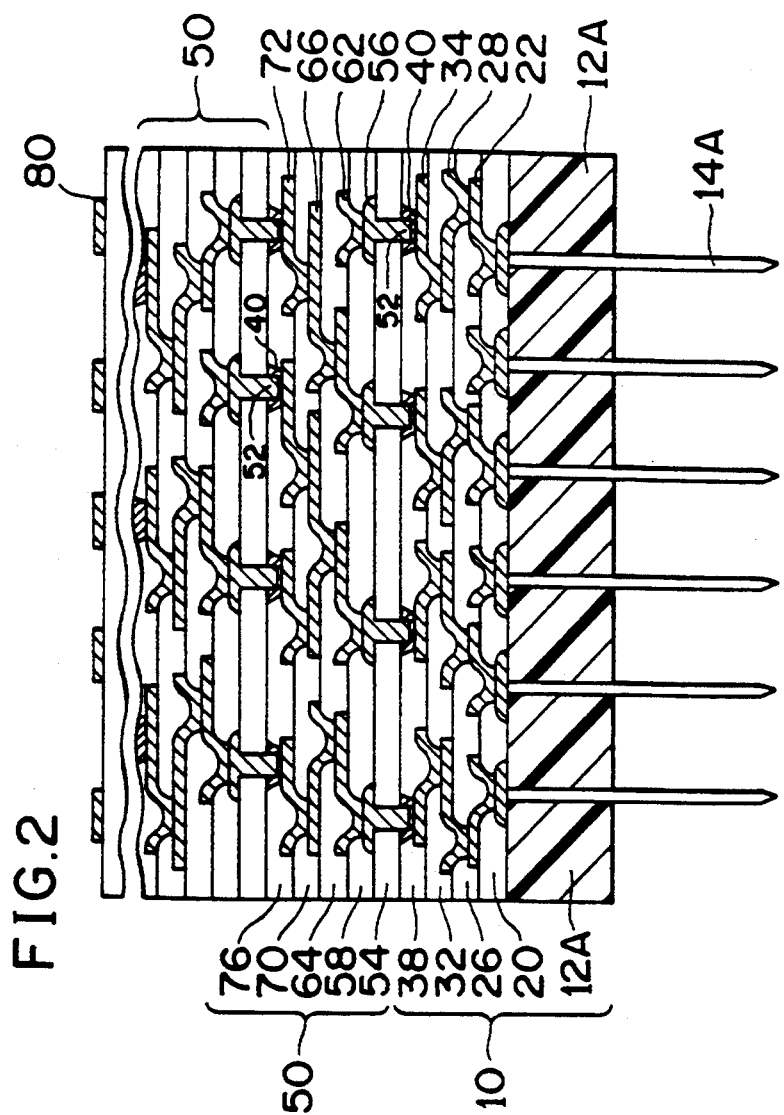
FIG. 2 is a schematic and elevational sectional view of a multilayer wiring board which embodies the invention and has a hard resin substrate.

FIG. 2 shows another example of multilayer wiring boards according to the invention. This multilayer wiring board is fundamentally similar to that of FIG. 1, but in this example a hard resin substrate 12A is employed in place of the ceramic substrate 12 in FIG. 1. For example, the substrate 12A is a molding of a polyimide resin. The resin substrate 12A is pierced with a plurality of input-output terminal pins 14A each of which is tightly inserted into a through-hole in the substrate. The important merit of using the polyimide substrate 12A is the possibility of accurately matching the thermal expansion coefficient of the substrate and that of the polyimide layers which are supporting the wiring layers. Accordingly the use of this substrate 12A is particularly suitable when the multilayer wiring board has a relatively large area and/or a relatively large number of wiring and insulating layers.

EXAMPLE 1

This example relates to a method of producing a multilayer wiring board of the type shown in FIG. 1.

The major part of each of the blocks 50 is formed by the process illustrated in FIGS. 3(A) to 3(E), wherein the grounding wiring layer 56 and the polyimide layer 58 in the block 50 of FIG. 1 are omitted for the sake of simplification.

Figure 3A:
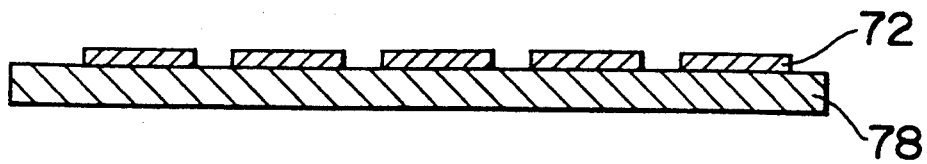
FIGS. 3(A) to 3(E) illustrate a process of making a temporary block in producing a multilayer wiring board according to the invention.

Referring to FIG. 3(A), at the initial step (a) the interconnecting and grounding wiring layer 72 is formed on a flat plate of aluminum 78 by the usual substeps of forming a wiring pattern by a photolithography technique using a photoresist, electroplating the pattern with gold and removing the photoresist film. At next step (b) shown in FIG. 3(B) the polyimide layer 70 having a plurality of via holes 71 at predetermined locations is formed on the aluminum plate 78 so as to overlay the wiring layer 72 by using a photosensitive polyimide. The polyimide layer 70 with the via holes 71 is formed by applying a polyimide varnish which is a precursor of the polyimide to the aluminum plate 78, removing the varnish layer in the areas of the respective via holes 71 by exposure to actinic light with masking and subsequent development and then curing the varnish layer.

Figure 3B:
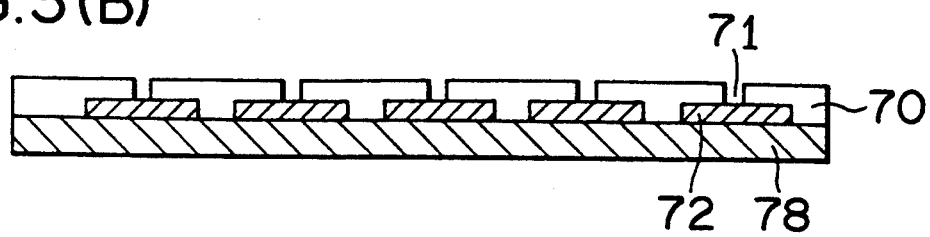
Figure 3C:
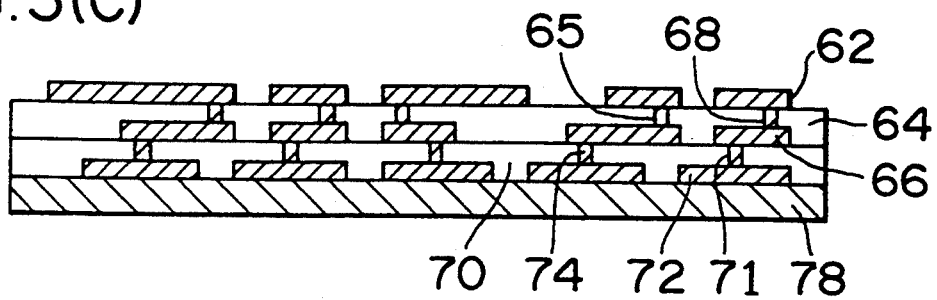

At next step (c) illustrated in FIG. 3(C) the via holes 71 in FIG. 3(B) are filled with gold to provide the interlayer conductors 68, and the signaling wiring layer 66 is formed on the polyimide layer 70 by the same method as in the step (a). Then the wiring layer 66 is overlaid with the polyimide layer 64 having via holes 65 by the same method as in the step (b), and the signaling wiring layer 62 is formed on the polyimide layer 64 together with the interlaminar conductors 68 in the via holes 65 by the same method as in the step (a). According to the need the operations in the step (c) are extended until an intended number of wiring layers and insulating polyimide layers are formed.

At next step (d) shown in FIG. 3 (D) the wiring layer 62 is overlaid with the polyimide layer 54 which is formed with a plurality of via holes 55 at predetermined locations by the same method as in the step (b). This polyimide layer 54 is formed by using a photosensitive polyimide resin having a glass transition temperature. It is optional to use the same polyamide resin for any of the other polyimide layers. Examples of commercial polyimides of this type are PL-1200 of Hitachi Kasei Inudstrial Co., PI-2702D of DuPont Japan, Ltd., PHOTONYSE of Toray Co. and PIMEL of Asahi Kasei Industrial Co.

Figure 3D:
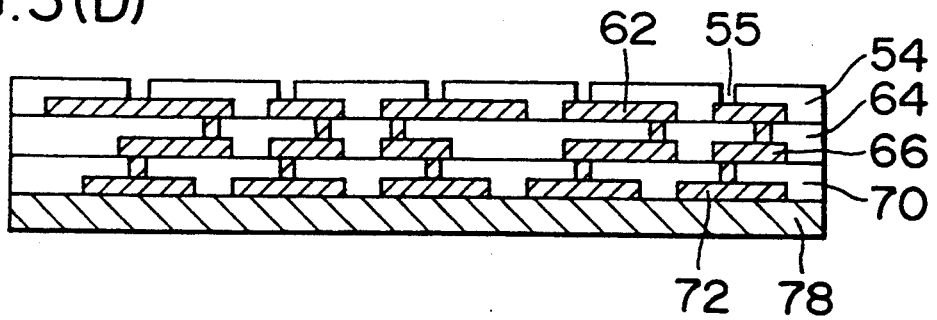
Figure 3E:
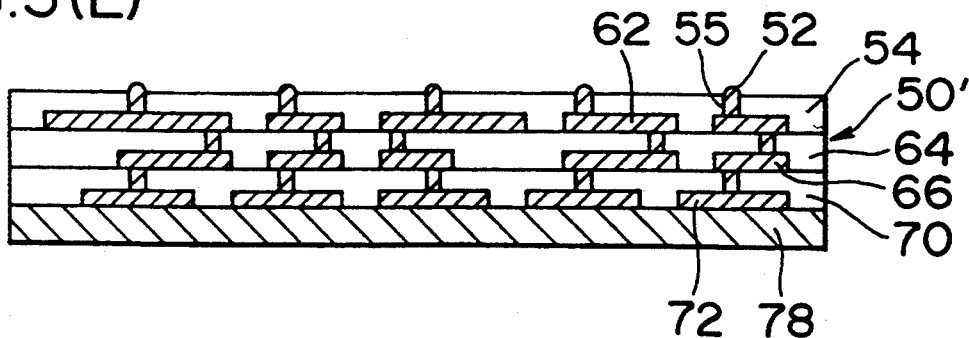

At next step (e) shown in FIG. 3(E) the via holes 55 in FIG. 3(D) are filled with gold, and the metal bumps 52 are formed on the surface of the polyimide layer 54 at the locations of the respective via holes 55 by first making patterning by photolithography using a photoresist, then electroplating the patterned areas with nickel to a thickness of about 10 $\mu$m and then electroplating the nickel plated areas with gold to a thickness of about 3 $\mu$m. The nickel plating is for the purpose of preventing diffusion of the gold-tin solder (described hereinafter) used as the solder pools 40 in FIG. 1 into the gold wiring layer 562.

The product of the above process, steps (a) to (e), is a temporary block 50' having three layers of wiring on the aluminum plate 78. A number of temporary blocks 50' are produced by the same process, and the obtained blocks 50' are subjected to electrical inspection to exclude defective blocks and use only acceptable blocks 50' in the subsequent assembling operations.

The base block 10 is formed by the process illustrated in FIGS. 4(A) to 4(G). At the initial step (a) shown in FIG. 4(A) the interconnecting and grounding wiring layer 18 is formed on the top surface of the ceramic substrate 12 provided with the input-output terminal pins 14 and the interconnection conductors 16 by the substeps of forming a wiring pattern by a photolithography technique using a photoresist, electroplating the pattern with gold and removing the photoresist film. At next step (b) shown in FIG. 4(B) the wiring layer 18 is overlaid with the polyimide layer 20 having a plurality of via holes 21 at predetermined locations. The polyimide layer 20 with the via holes 21 is formed by applying a photosensitive polyimide varnish which is a precursor of the polyimide to the ceramic substrate 12, removing the varnish layer in the areas of the respective via holes 21 by exposure to actinic light with masking and subsequent development and then curing the varnish layer.

Figure 4A:
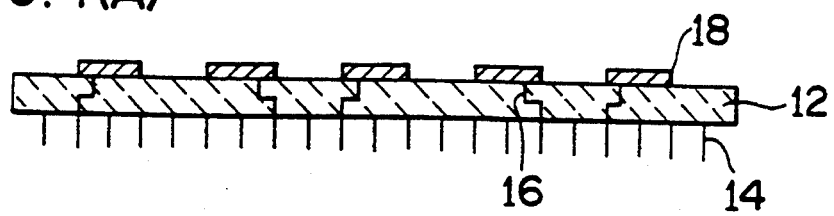
FIGS. 4(A) to 4(G) illustrate a process of making a base block in producing a multilayer wiring board according to the invention.
Figure 4B:
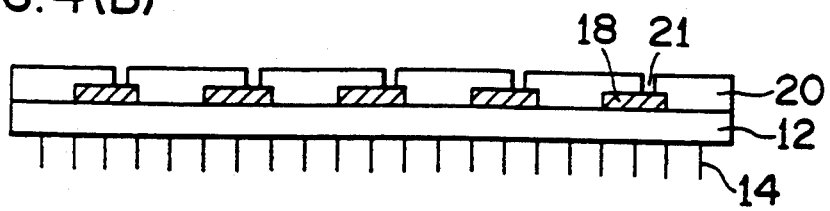
Figure 4C:
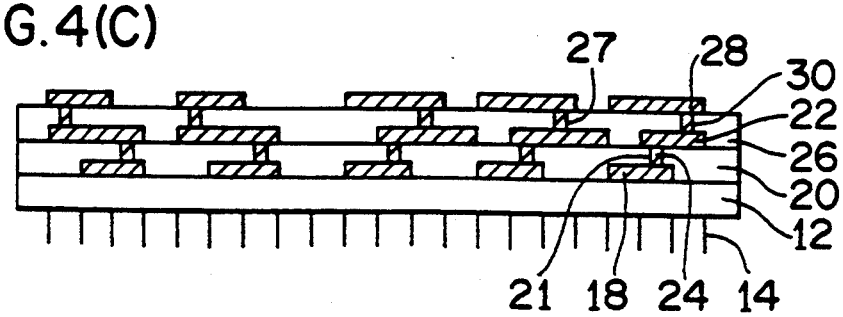

At next step (c) illustrated in FIG. 4(C) the via holes 21 in FIG. 3(B) are filled with gold to provide the interlayer conductors 24, and the signaling wiring layer 22 is formed on the polyimide layer 20 by the same method as in the step (a). Then the wiring layer 22 is overlaid with the polyimide layer 26 having via holes 27 by the same method as in the step (b), and the signaling wiring layer 28 is formed on the polyimide layer 26 together with the interlaminar conductors 30 in the via holes 27 by the same method as in the step (a).

Figure 4D:
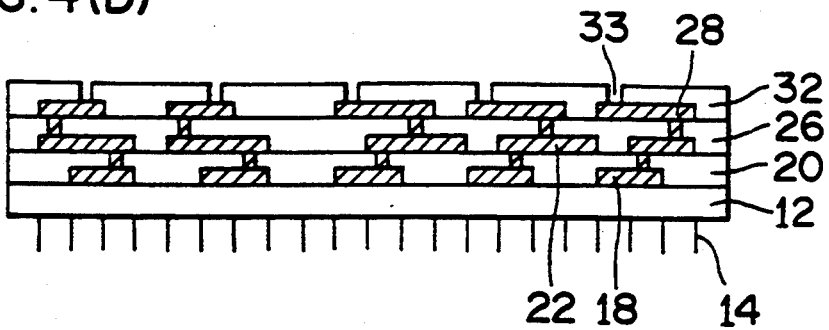
Figure 4E:
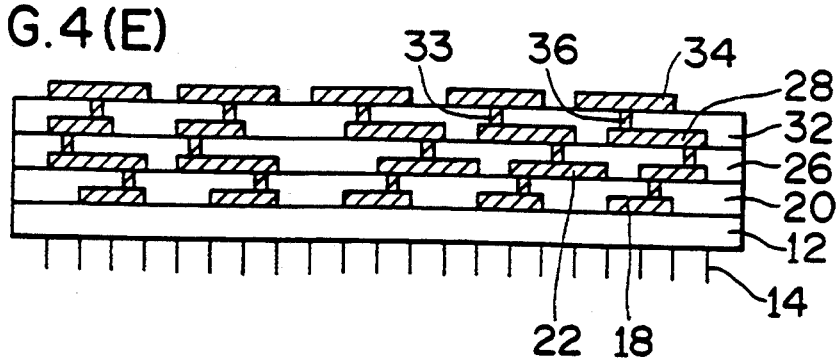

At next step (d) shown in FIG. 4(D) the wiring layer 28 is overlaid with the polyimide layer 32 having a plurality of via holes 33 by the same method as in the step (b). At next step (e) shown in FIG. 4(E) the via lo holes 33 in FIG. 4(D) are filled with gold to provide the interlaminar conductors 36, and the interconnecting and grounding wiring layer 34 are formed on the polyimide layer 32 by the same method as in the step (a).

Figure 4F:
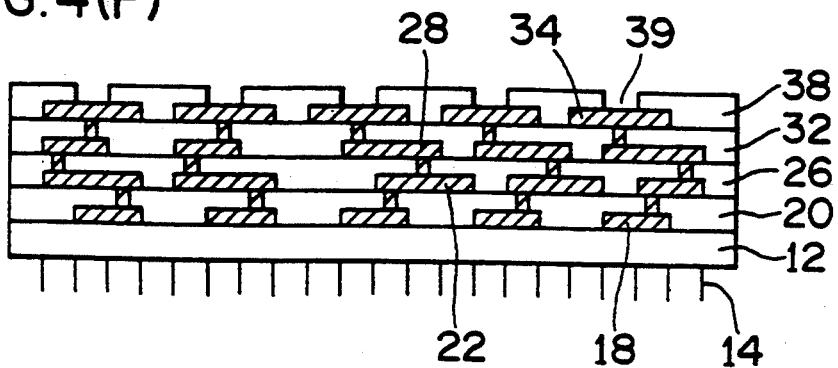

At next step (f) shown in FIG. 4(F) the wiring layer 34 is overlaid with the polyimide layer 38 having a plurality of via holes 39 by the same method as in the step (b). This polyimide layer 38 is formed by using a photosensitive polyimide resin having a glass transition temperature. It is optional to use the same polyimide resin for the precedingly formed polyimide layers.

Figure 4G:
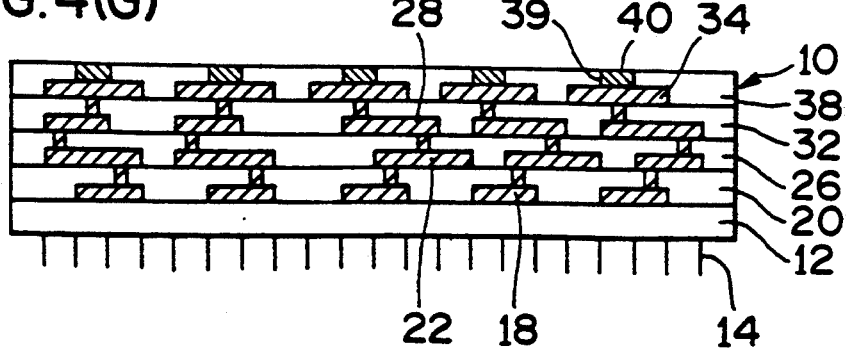

At next step (g) illustrated in FIG. 4(G) the solder pools 40 are produced by using the via holes 39 in the polyimide layer 38 and by the steps of making patterning by photolithography using a photoresist, electroplating the patterned areas with nickel to a thickness of about 3 μm and then alternating tin plating and gold plating, both by electroplating, so as to form a multilayer plating on the nickel plating. In the subsequent operation for heat bonding the block 10 to the base block 50 the gold-and-tin multilayer plating melts into a gold-tin alloy solder. The thickness ratio of the gold plating to the tin plating is 10:7 so that the weight ratio of gold to tin becomes 4:1. The multilayer plating consists of six layers of gold plating each of which is 1 μm in thickness and six layers of tin plating each of which is 0.7 μm in thickness. That is, the whole thickness of the multilayer plating reaches 10.2 μm, which becomes the effective depth of the gold-tin solder pools 40. By this operation the production of the base block 10 is completed.

A suitable number of base blocks 10 are produced by the same process, and the obtained blocks 10 are subjected to electrical inspection to use only good blocks 10 in the subsequent assembling operations.

Figure 5A:
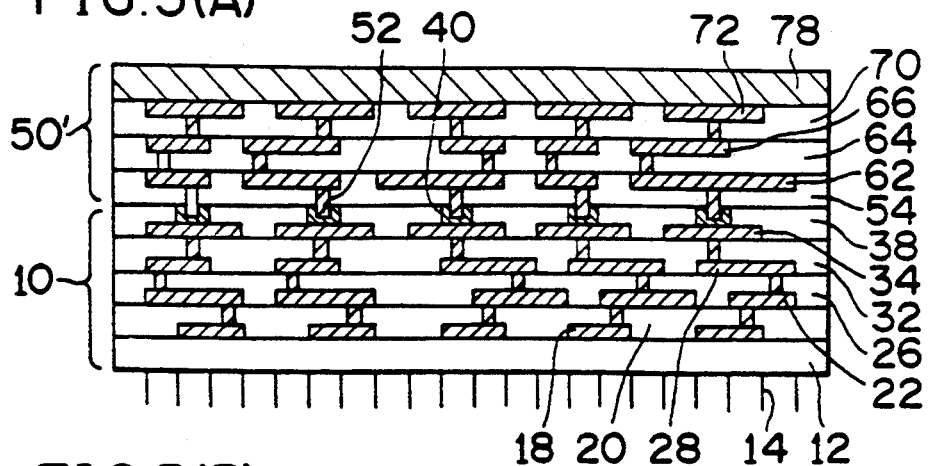
FIGS. 5(A) to 5(C) illustrate a process of assembling a plurality of blocks obtained by the processes illustrated in FIGS. 3(A) to 3(E) and FIGS. 4(A) to 4(G) into a multilayer wiring board.
Figure 5B:
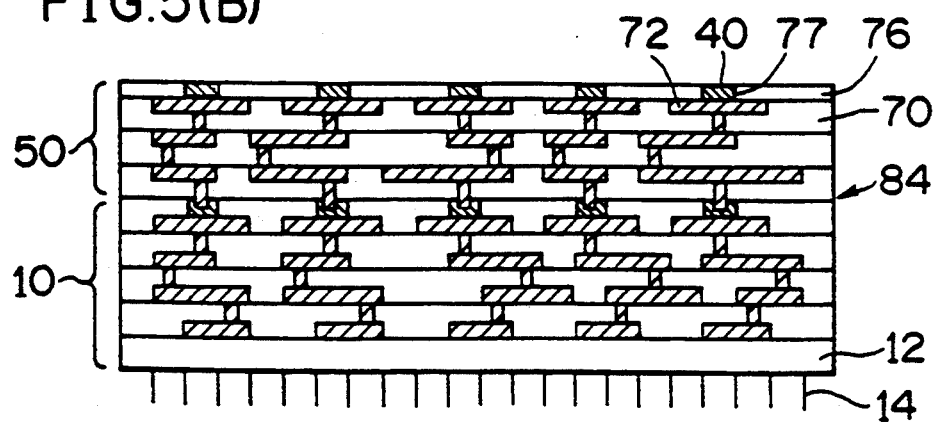
Figure 5C:
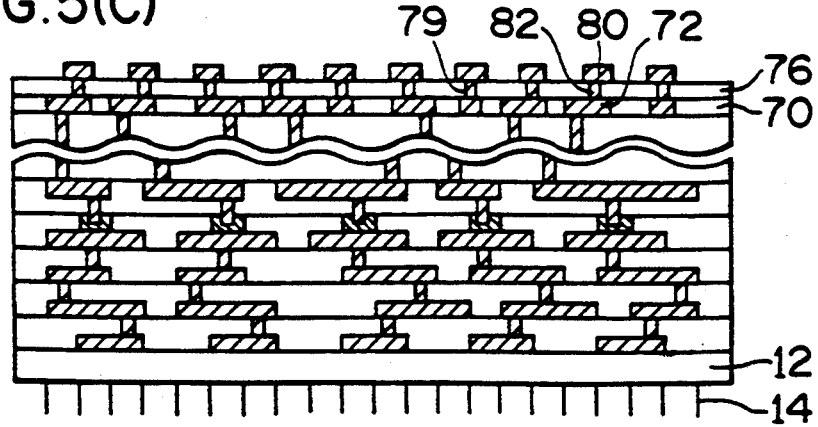

FIGS. 5(A) to 5(C) illustrate the process (in Example 1) of assembling a multilayer wiring board of the type shown in FIG. 1 from one base block 10 and a plurality of temporary blocks 50'.

Referring to FIG. 5(A), at first a first temporary block 50' is placed the aluminum plate 78 up on the base block 10 after making alignment so as to bring the metal bumps 52 of the block 50' into alignment with the solder pools 40 in the base block 10, respectively. Then the two blocks 10, 50' are heated to a temperature above the glass transition temperature of the polyimide of the top layer 38 of the block 10 and the layer 54 of the block 50' while a pressure is applied so as to press the two blocks 10, 50' against each other. By this operation the two polyimide layers 38 and 54 adhere to each other so that the two blocks 10, 50' bond to each other. Simultaneously each of the bumps 52 intrudes into and bonds to the opposite solder pool 42 since the gold-and-tin multilayer plating that constitutes the solder pools 40 melts and turns into an alloy solder of gold and tin. Consequently the two blocks 10 and 50' are fixed to each other and electrically connected to each other. In this example the heating and pressing operation is performed by using a vacuum press apparatus of autoclave type and nitrogen gas as the pressurizing gas. In the apparatus the provisional assembly of the two blocks 10, 50' is placed on a platen and sealed up in a bag of a plastic film, and the interior of the bag is evacuated to reduce the interior pressure to 10 Torr or below. In the vacuum press apparatus the nitrogen gas pressure is maintained at about 3 kg/cm$^2$ while the temperature of the blocks 10, 50' is raised up to about 250° C., and then the gas pressure is raised to about 14 kg/cm$^2$ while the temperature is raised from about 250° C. up to about 350° C.

Referring to FIG. 5(B), at the next step the aluminum plate 78 is removed from the assembly of the two blocks 10 and 50' by immersing the assembly in 16% aqueous solution of hydrochloric acid thereby dissolving the aluminum plate. As the result the wiring layer 72 of the block 50' is exposed. After washing and drying, the exposed wiring layer 72 is overlaid with a layer 76 of a photosensitive polyimide having a glass transition temperature. A plurality of via holes 77 are formed in this polyimide layer 76 at predetermined locations by an exposure and development process, and thereafter the polyimide layer 76 is cured. Then the via holes 77 are used to form solder pools 40 by making multilayer plating of gold and tin. By these operations the temporary block 50' in FIG. 5(A) turns into one of the blocks 50 in the multilayer wiring board of FIG. 1. (As noted hereinbefore, in FIGS. 5(A) to 5(C) the polyimide layer 58 and the wiring layer 56 are omitted.)

The assembly 84 of the blocks 10 and 50 shown in FIG. 5(B) is a multilayer wiring board. When it is intended to produce a multilayer wiring board having a larger number of wiring layers, the operations described with reference to FIGS. 5(A) and 5(B) are repeated by using another or additional temporary block(s) 50' until the intended number of wiring layers are incorporated into the multilayer board.

Referring to FIG. 5(C), at the final step the electrode pads 80 shown in FIG. 1 are formed on the top surface of the uppermost block 50. These pads 80 are for mounting chip carriers (not shown) in each of which a LSI chip is sealed up on the multilayer wiring board by soldering the bumps of the respective chip carriers to the pads 80. To use a tin-lead solder in the soldering operation the pads 80 are formed by copper plating which is compatible with tin-lead eutectic solder. The pads 80 are formed by first forming a polyimide layer 76 having via holes 77 substantially in the same manner as the formation of the polyimide layer 76 with via holes 77 in FIG. 5(B) and then, instead of forming the solder pools 40 in FIG. 5(B), making copper plating to produce interconnection conductors 82 in the via holes 79 and build up the copper pads 80. By this operation the production of a multilayer wiring board of the type shown in FIG. 1 is completed.

In this example gold is used as the wiring metal, but this is not limitative. It is also possible to use a different metal relatively low in resistivity, such as copper.

In Example 1 the gold-tin solder pools 40 are formed by multilayer plating of gold and tin, and the metal bumps 52 is formed by gold plating on nickel plating. That is, the solder pools 40 are formed by multilayer plating of two kinds of elemental metals which are the constituents of the solder, and the bumps 52 contain one of the constituents of the solder used in the pools 40. Such combination is favorable for sure and stable connection of the respective bumps 52 to the solder pools 40.

In assembling the base block 10 and the temporary block 50' by the operations described hereinbefore with reference to FIG. 5(A), the gold-tin multilayer plating (40) melts at a temperature of about 280° C. and turns into a gold-tin alloy solder. Then the gold bumps 52 intrude into the pools 40 of the molten gold-tin alloy solder, and some gold of the bumps 52 fuses and diffuses into the gold-tin alloy whereby the content of gold in the gold-tin alloy solder slightly increases. After that the solder solidifies as the temperature lowers after completion of the heating and pressurizing operation, and consequently the respective bumps 52 are fixed to and electrically connected to the solidified solder pools 40. Since the content of gold has increased the melting point of the solidified gold-tin solder (40) becomes considerably higher than the melting point (about 280° C.) of the initial gold-tin solder. It has been confirmed by DSC analysis that the melting point of the gold-tin solder (40) solidified in the assembly shown in FIG. 5(A) is higher than 600° C. Therefore, at the stage of bonding another block 50' to the assembly of the blocks 10 and 50 the heating to about 350° C. does not cause melting of the previously melted and solidified solder pools 40, so that the previously established electrical connection between the blocks 10 and 50 does not break or loose.

EXAMPLE 2

This example is fundamentally similar to Example 1, but there is a difference in the means for electrical connection between two adjacent blocks. Besides, there are some changes in materials.

A photosensitive polyimide resin having a glass transition temperature of about 270° C. is used for the insulating layers of each block 10, 50. In every block each wiring layer is formed by multilayer plating of copper and nickel. The total thickness of copper plating is 6.5 $\mu$m, and the total thickness of nickel plating is 0.5 $\mu$m. Nickel plating is employed as a barrier metal to prevent direct contact of the copper plating with the polyimide layers because the photosensitive polyimide used in this example is liable to react with metallic copper.

Figure 6:
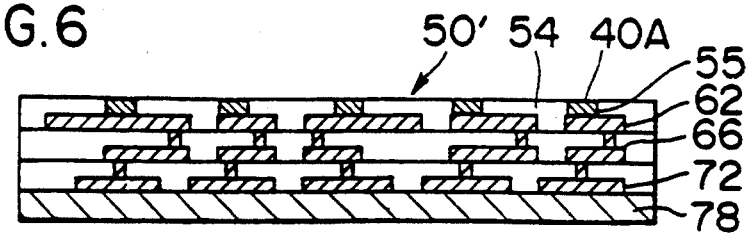
FIG. 6 shows a partial modification of the process illustrated in FIGS. 3(A) to 3(E)

In producing each of the temporary blocks 50', the steps (a) to (d) in Example 1 illustrated in FIGS. 3(A) to 3(D) are unchanged. Referring to FIG. 6, at the next step (e) a plurality of tin-lead solder pools 40A are formed in the polyimide layer 54 by using the via holes 55 formed at the step (d). The tin-lead solder pools 40A are formed by electroplating after patterning by photolithography using a photoresist. The thickness of the tin-lead solder plating, viz. depth of the solder pools 40A, is 10 $\mu$m.

Figure 7:
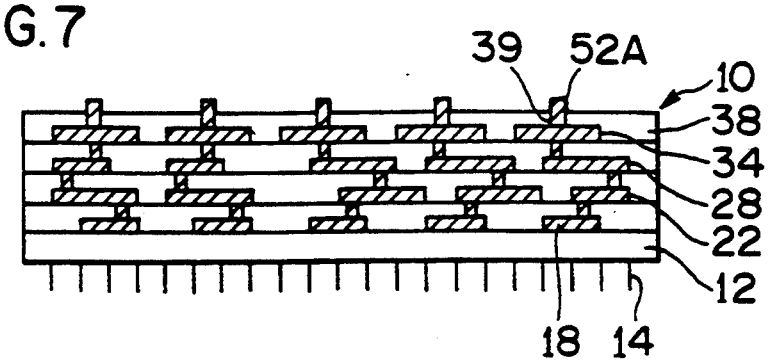
FIG. 7 shows a partial modification of the process illustrated in FIGS. 4(A) to 4(G)

In producing the base block 10, the steps (a) to (f) in Example 1 illustrated in FIGS. 4(A) to 4(F) are unchanged. Referring to FIG. 7, at the final step (g) a plurality of copper bumps 52A are formed on the surface of the polyimide layer 38 at the locations of the via holes 39 formed in the step (f). The bumps 52A are formed by electroplating after patterning by photolithography using a photoresist. The thickness of each copper bump 52A is 15 $\mu$m.

Figure 8A:
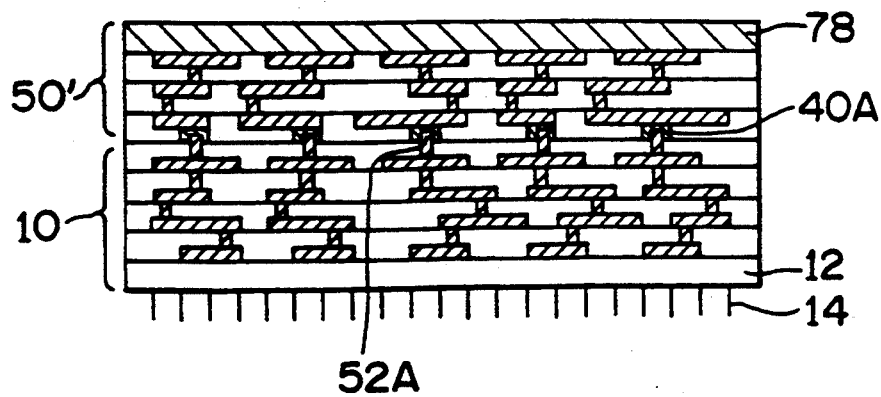
FIGS. 8(A) to 8(C) illustrate a process of assembling a multilayer wiring board using the blocks shown in FIGS. 6 and 7.
Figure 8B:
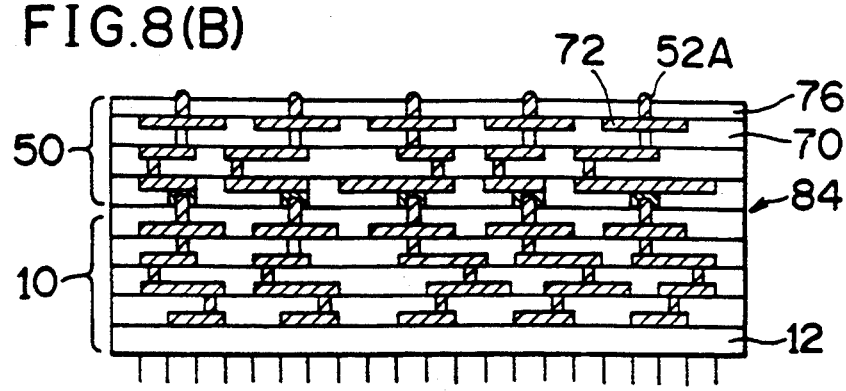
Figure 8C:
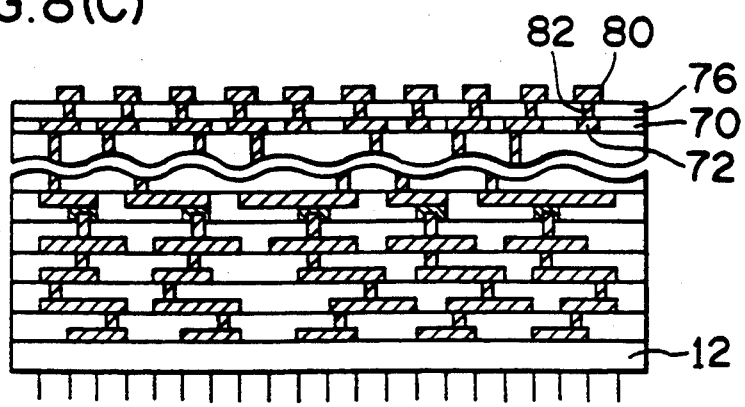

As shown in FIGS. 8(A) to 8(C), the assembling operations are similar to the operations in Example 1 illustrated in FIGS. 5(A) to 5(C), though in this example a block (50') having solder pools 40A in the bottom surface is placed on a block (10 or 50') having metal bumps 52A on the top surface.

EXAMPLE 3

This example is a modification of Example 1 in respect of the means for mechanically fixing two adjacent blocks. In this example, a photosensitive polyimide resin which is low in thermal expansion coefficient and does not have a glass transition temperature, e.g. TL(E)X1 of Asahi Kasei Industrial Co., is used for every polyimide layer in each block.

In producing each of the temporary blocks 50', the steps (a) to (e) in Example 1 illustrated in FIGS. 3(A) to 3(E) are unchanged.

Figure 9:
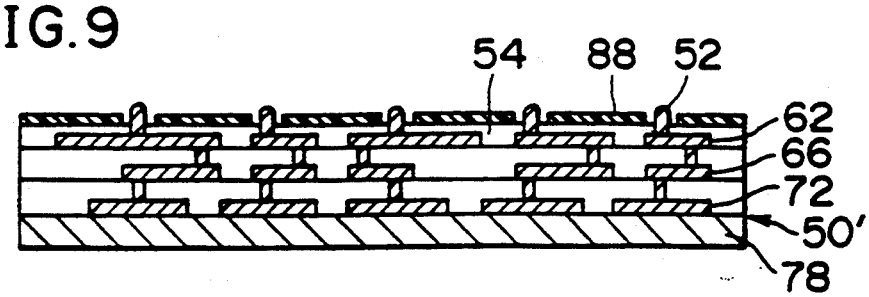
FIG. 9 and FIGS. 10(A) and 10(B) illustrate a part of a process of producing a multilayer wiring board according to the invention using an adhesive resin.

Referring to FIG. 9, a varnish of a thermosetting maleimide resin is applied to the top surface of the temporary block 50' so as to entirely cover the exposed surface of the polyimide layer 54 and the metal bumps 52, and the varnish is dried in an oven of the hot-air circulation type thereby to form a maleimide layer 88. Then the maleimide layer 88 is selectively removed only in the areas of the metal bumps 52 by the following process. First a copper film (not shown) having a thickness of about 0.5 $\mu$m is formed over the maleimide layer 88 except the areas of the bumps 52 by a lift-off process including a photolithography step using a photoresist and a sputtering step to deposit copper. Then the maleimide layer exposed in the areas of the bumps 52 is removed by plasma etching using oxygen gas thereby to expose the bumps 52. After that the copper film is removed by a wet etching method.

The base block 10 is produced in the same manner as in Example 1 except that the solder pools 40 are formed by using a lead-bismuth solder. The solder is filled into the via holes 51 by an inlaying printing method after making a photoresist mask on the polyimide layer 38.

Figure 10A:
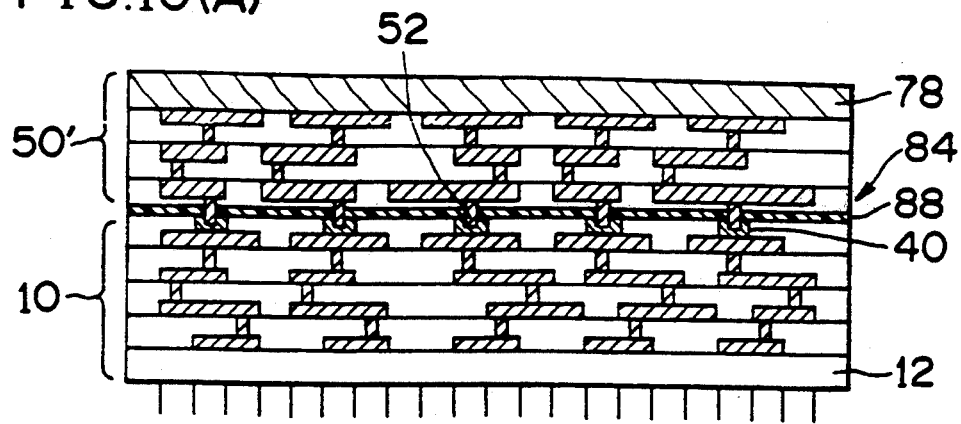

Referring to FIG. 10(A), a first temporary block 50' having the maleimide layer 88 is placed the aluminum plate 78 up on the base block 10 after making alignment so as to bring the metal bumps 52 of the block 50' into alignment with the solder pools 40 in the base block 10, respectively. Then the two blocks 10, 50' are heated to the flow temperature of the maleimide resin 88 while a pressure is applied so as to press the two blocks 10, 50' against each other. Since the melted maleimide resin 88 functions as an adhesive the two blocks 10 and 50' are bonded to each other. Simultaneously each of the bumps 52 intrudes into and bonds to the opposite solder pool 42 since the lead-bismuth solder melts by the heating. Consequently the two blocks 10 and 50' are fixed to each other and electrically connected to each other. The heating and pressurizing operation is performed by using a vacuum press apparatus of autoclave type and nitrogen gas as the pressurizing gas. The operation is generally as described in Example 1. In this example the nitrogen gas pressure in the apparatus is maintained at about 3 kg/cm$^2$ while the temperature is raised up to about 130° C., and then the gas pressure is raised to about 14 kg/cm$^2$ while the temperature is raised from about 130° C. to about 180° C.

Figure 10B:
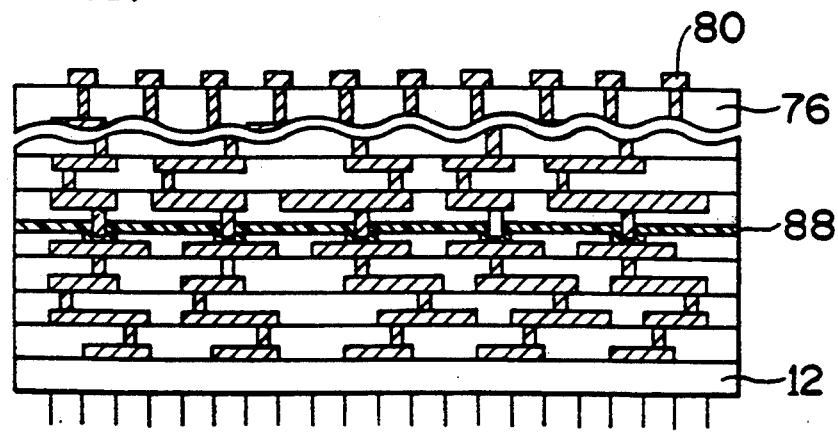

At the next step the aluminum plate 78 is removed from the assembly 84 of the two blocks 10 and 50', and a predetermined number of additional blocks (50) are mounted on this assembly 84. Finally, as shown in FIG. 10(B), the electrode pads 80 are formed on the top surface of the uppermost block 50. These operations are the same as in Example 1.

EXAMPLE 4

In producing a multilayer wiring board of the shown in FIG. 1, a thermoplastic copolymer of tetrafluoroethylene and perfluoroalkylvinyl ether (the copolymer is referred to as PFA) is used as an adhesive to bond the two adjacent blocks to each other. A photosensitive polyimide resin which is low in thermal expansion coefficient and does not have a glass transition temperature is used for every insulating layer in each block.

The temporary blocks 50' are produced by the same process as in Example 2.

Figure 11:
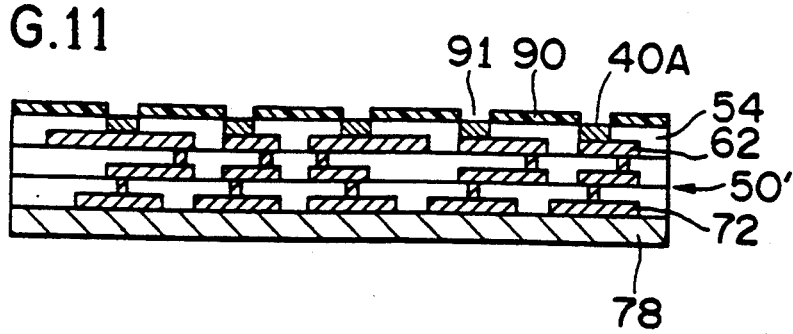
FIGS. 11 and 12 illustrate a partial modification of the process illustrated in FIGS. 9, 10(A) and 10(B)

Referring to FIG. 11, for each temporary block 50' a film 90 of PFA is precedingly processed so as to form a plurality of openings 91 which are arranged in conformity with the tin-lead solder pools 40A in the top surface of the block 50'. After alignment the PFA film 90 is placed on the block 50' and provisionally bonded to the top surface of the block 50' by heat pressing at about 100° C. As the result, the solder pools 40A are left exposed respectively by the openings 91 of the PFA film 90.

The base block 10 is produced by the same process as in Example 2.

Figure 12:
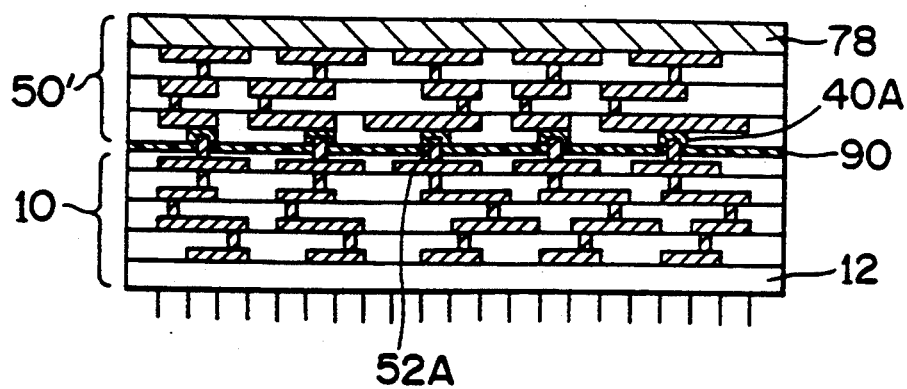

Referring to FIG. 12, the base block 10 and a first temporary block 50' having the PFA film 90 are assembled together by fundamentally the same method as in Example 2 by using a vacuum press apparatus of autoclave type. In this example, in the apparatus the nitrogen gas pressure is maintained at about 3 kg/cm$^2$ while the temperature is raised to about 130° C., and thereafter the gas pressure is maintained at about 14 kg/cm$^2$ while the temperature is raised from about 130° C. to the flow temperature of PFA, viz. about 180° C.

The subsequent operations for completing the multilayer wiring board are the same as in Example 2.

In Examples 3 and 4 the adhesive film (88 or 90) is provided to only one of the two adjacent blocks. However, when the polyimide surfaces of the two blocks have relatively large undulations it is better to overlay the polyimide surface of each block with the adhesive film so that the two adhesive films come into contact with each other for the purpose of reducing the unfavorable influence of undulations in the contacting surfaces on the ahesive bonding.

EXAMPLE 5

This example is generally similar to Example 1. However, in this example the solder pools 40 in Example 1 are changed to pools of a dispersion of gold in a polyimide resin.

In producing the temporary blocks 50' by the process described in Example 1, the final step (e) for forming the bumps 52 is slightly modified. That is, the bumps 52 are formed by electroplating of gold to a thickness of 10 $\mu$m. Nickel plating is omitted since this example does not use gold-tin solder to form the pools 40.

In producing the base block 10 by the process described in Example 1, the via holes 39 shown in FIG. 4(F) are filled with a gold-polyimide paste which contains 80–95 wt % of gold powder and has a viscosity of 80–120 kcp at room temperature. A conductive composite material obtained by solidifying the gold-polyimide paste has a sheet resistivity of 25–30 m$\Omega$/square. To form gold-polyimide pools corresponding to the solder pools 40 shown in FIG. 4(G) the gold-polyimide paste is applied by an inlaying printing method after making a photoresist mask by photolithography.

The base block 10 having the gold-polyimide pools (40) and a first temporary block 50' are assembled together by the same method as in Example 1 by using a vacuum press apparatus of autoclave type.

The subsequent operations for completing the multilayer wiring board are the same as in Example 1 except that after removing the aluminum plate 78 of each block 50' gold-polyimide pools are formed in the polyimide layer 76 shown in FIG. 5(B) instead of the solder pools 40 in Example 1.

Also it is possible to modify Example 2 by changing the solder pools 40A in the temporary block 50' shown in FIG. 6 to gold-polyimide pools, or to modify either Example 3 (use of the maleimide film 88) or Example 4 (use of the PFA film 90) by changing the solder pools 40 in FIG. 10(A) or FIG. 11 to gold-polyimide pools.

The use of a dispersion of gold in polyimide is not limitative. It is also possible to use a dispersion of a different metal which is sufficiently high in conductivity in polyimide. For example, the metal may be copper, silver, palladium or silver-palladium alloy. It is rather preferable to use a dispersion of a noble metal in polyimide in view of resistance to corrosion or oxidation, but copper also is a practicable metal. For example, when copper is employed as the wiring metal as in Example 2 or Example 4, a dispersion of copper powder in an aromatic polyimide varnish may be used to form copper-polyimide pools corresponding to the solder pools 40A in FIG. 6 or the solder pools 40 in FIG. 10(A).

In the foregoing examples the electrical connection between two adjacent blocks is made by using metal bumps on one block and solder (or metal-polyimide) pools in the opposite block. Also it is possible to employ a bump-to-bump connection method as is illustrated by the following example.

EXAMPLE 6

Figure 13:
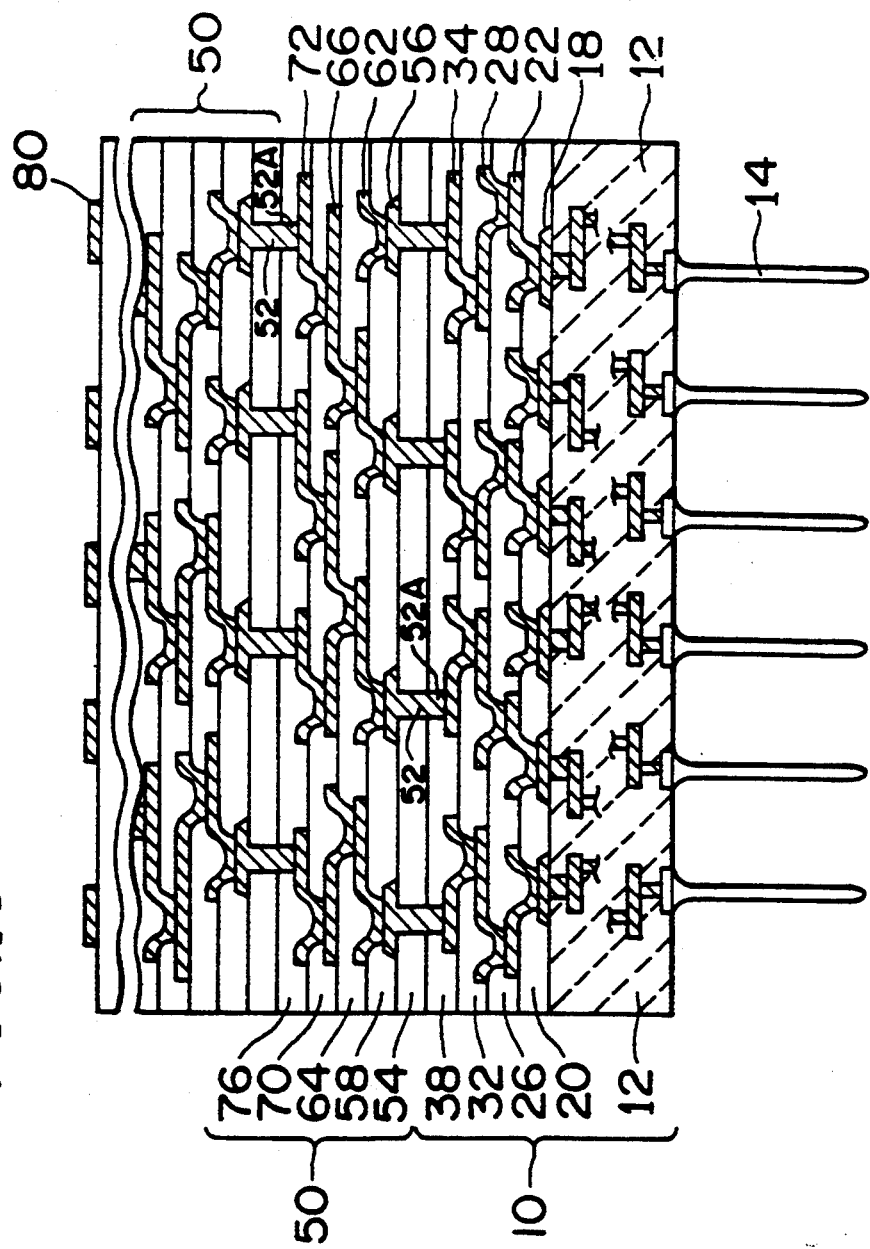
FIG. 13 is a schematic and elevational sectional view of a multilayer wiring board which is another embodiment of the invention.

FIG. 13 shows a multilayer wiring board which is almost identical with that shown in FIG. 1. However, in this multilayer wiring board two adjacent blocks are electrically connected to each other by joining a plurality of solder bumps 52 on one block to a plurality of solder bumps 52A on the opposite block, respectively. This multilayer wiring board is produced by the following process.

Figure 14:
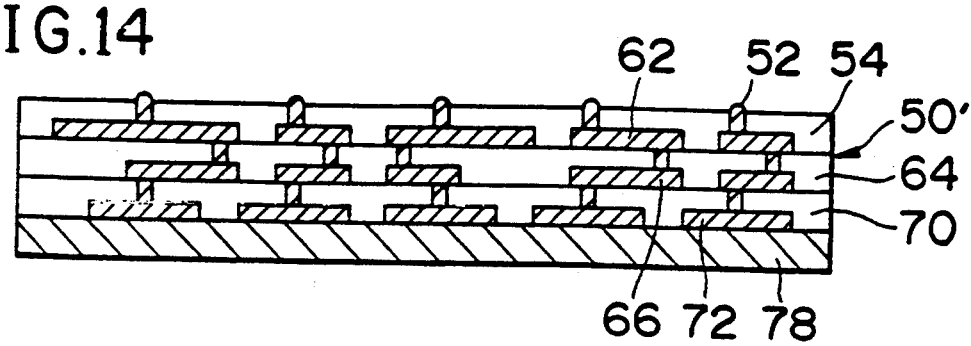
FIG. 14 shows a temporary block having metal bumps.

FIG. 14 shows a temporary block 50' which is produced by substantially the same process as in Example 1. In this example the metal bumps 52 on the block 50' are formed of a multilayer plating of gold and tin. In advance electroplating of nickel is made to a thickness of about 3 $\mu$m. The multilayer plating is made by electroplating. The thickness ratio of gold plating to tin plating is 10:7 so that the weight ratio of gold to tin becomes 4:1. The multilayer plating consists of six layers of gold plating and each of which is 1 $\mu$m in thickness and six layers of tin plating each of which is 0.7 $\mu$m in thickness. That is, the whole thickness of the multilayer plating reaches 10.2 $\mu$m. In the subsequent operation for heat bonding of two blocks the multilayer plating melts into a gold-tin alloy solder. Each of the bumps 52 has an area of 50–500 m square.

Figure 15:
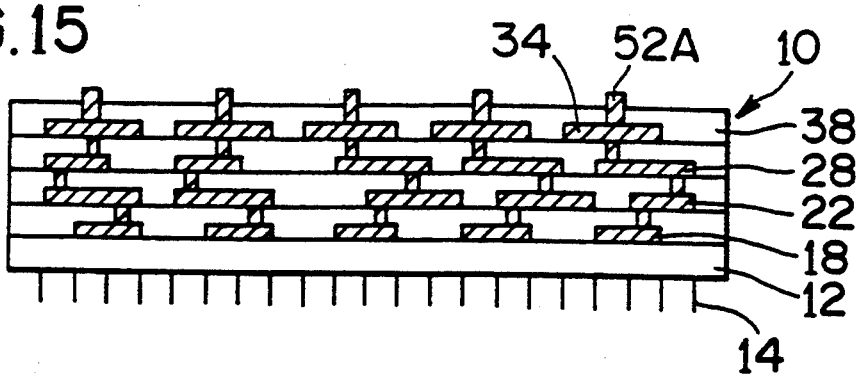
FIG. 15 shows a base block having metal bumps.

FIG. 15 shows a base block 10 which is produced by substantially the same process as in Example 2. In this example the wiring metal is gold, and the metal bumps 52A on the base block 10 are formed by the above described gold-and-tin multilayer plating operation.

Figure 16A:
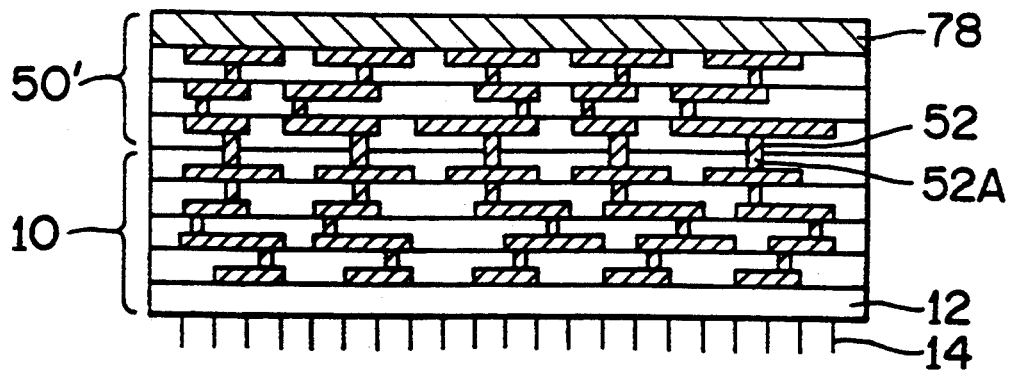
FIGS. 16(A) and 16(B) illustrate the process of bonding the blocks of FIGS. 14 and 15 to each other.

Referring to FIG. 16(A), the temporary block 50' of FIG. 14 is placed on the base block 10 of FIG. 15 so as to align the bumps 52 of the block 50' to the bumps 52A of the block 10. Then heat and pressure are applied by using the vacuum press apparatus described in Example 1. The heating and pressurizing conditions are the same as in Example 1. By this operation the two blocks 10 and 50' mechanically bond to each other by adhesion of the softened polyimide (having a glass transition temperature of about 270° C.) used in the two blocks. Simultaneously the gold-and-tin multilayer plating that forms the bumps 52, 52A of the respective blocks melts and turns into a gold-tin alloy solder, so that the respective bumps 52 of the block 50' join with the bumps 52A of the block 10. By solidification of the gold-tin solder the two blocks 10 and 50' are electrically connected to each other.

Figure 16B:
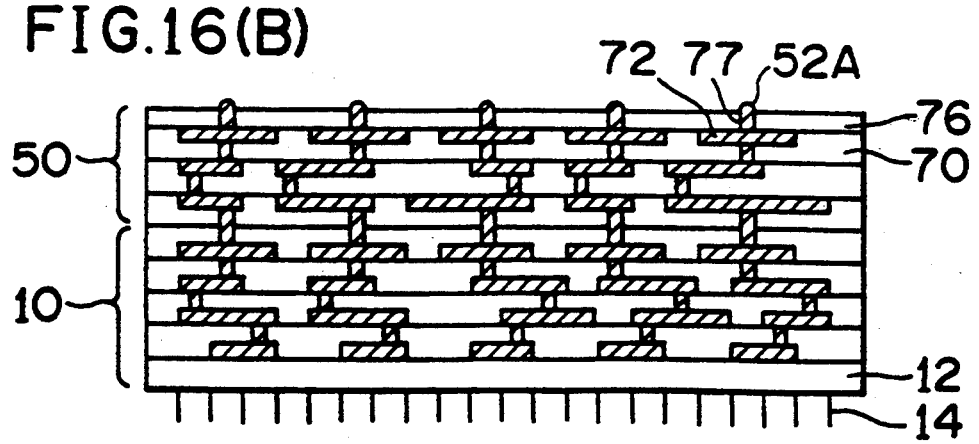

Referring to FIG. 16(B), after the above bonding operation the aluminum plate 78 is removed, and a polyimide layer 76 having via holes 77 is formed on the exposed wiring layer 72 in the same manner as in Example 2. Using the via holes 77 new bumps 52A are formed on the top surface by the above described gold-and-tin multilayer plating operation, and another temporary block (not shown) is placed on the assembly of FIG. 16(B) to repeat the bonding operation described with reference to FIG. 16(A).

It is a matter of course that the bump-to-bump connection method can be employed irrespect of the manner of mechanical bonding of two blocks to each other. For example, either Example 3 (using a thermosetting resin as adhesive) or Example 4 (using a thermoplastic resin as adhesive) can be modified so as to employ the bump-to-bump connection method. When the bonding operation is performed at a relatively low temperature it is suitable to use a lead-bismuth alloy solder or a tin-lead-bismuth alloy solder to form the bumps 52, 52A, and in such a case the solder bumps may be formed by a vacuum evaporation process.

Needless to mention the ceramic substrate 12 in FIG. 13 can be replaced by a hard resin substrate.

As will be understood from the foregoing examples, the present invention brings about a great decrease in the number of curing operations necessary for producing a multilayer wiring board using polyimide as the interlaminar insulation material. In producing a conventional multilayer wiring board of the sequential lamination type using polyimide as the insulating material it is necessary to perform curing operation for forming each polyimide layer (in other words, for each wiring layer), but according to the invention it suffices to perform curing operation for bonding one block to another block or precedingly bonded blocks. In the case of a multilayer wiring board having 12 layers of wiring and 12 insulation layers of polyimide, the conventional sequential lamination process needs to perform curing operation 12 times. As the curing operation is repeated many times thermal stress is applied to the polyimide of the already cured layers whereby the polyimide deteriorates. In the case of producing a multilayer wiring board having the same number of wiring layers by a method according to the invention using 4 blocks each having 3 layers of wiring, it suffices to perform curing operation 3 times. That is, the necessary number of curing operation becomes ¼ of that in the conventional process. Furthermore, according to the invention the necessary number of curing operation is determined by the total number of blocks irrespective of the number of wiring layers in each block, so that the advantage of the invention further augments when the number of wiring layers in each block is increased.

Also it is an important merit of the invention that the proportion or yield of acceptable products is remarkably enhanced. In the conventional sequential lamination process, when a defect occurs at any stage the preceding operations become in vain since the semi-processed board must be abandoned entirely. Therefore, the yield of acceptable products seriously lowers as the number of wiring layers is increased. In the present invention it is possible to make electrical inspection of each block prior to the assembling operations, and hence the yield of acceptable products does not significantly lower even though the total number of wiring layers is increased.

For convenience, in producing a multilayer wiring board having 12 layers of wiring it is assumed that the yield of good products in forming one layer of wiring is 95% in either the conventional sequential lamination process or the process according to the invention, and that in the process according to the invention (dividing the multilayer board into 4 blocks each having 3 layers of wiring) the yield of good products in bonding a block to another block is 95%.

In the conventional process:
ultimate yield $= (0.95)^{12} = 0.54$ ($= 54\%$)

In the present invention:
yield of block producing operations $= (0.95)^3 = 0.86$
yield of block bonding operations $= (0.95)^3 = 0.86$
ultimate yield $= 0.86 \times 0.86 = 0.74$ ($= 74\%$)

The advantage of the invention further augments when the number of wiring layers in each block is increased.

Besides, the method according to the invention is far better in productivity. By the conventional sequential laminating process the length of time necessary for producing a multilayer wiring board increases in proportion to the number of wiring layers. By the present invention the necessary length of time can greatly be reduced since a plurality of blocks that constitute the multilayer board can be produced simultaneously.

For convenience, in producing a multilayer wiring board having 12 wiring layers and 12 polyimide insulation layers it is assumed that it takes 1 day to form either one wiring layer or one insulation layer and that in the present invention it takes 1 day to bond one block to another block(s).

By the conventional process it takes 24 days to produce the multilayer wiring board by alternately and sequentially forming 12 wiring layers and 12 insulation layers.

By the invention (dividing the multilayer board into 4 blocks each having 3 wiring layers and 3 insulation layers) it takes only 9 days to produce the multilayer wiring board since 6 days are necessary for producing 4 blocks simultaneously and additional 3 days for uniting the 4 blocks.

In this regard too, the advantage of the invention further augments when the number of wiring layers in each block is increased.

As to the means to mechanically and electrically join the blocks in a multilayer wiring board according to the invention, another option is to use an anisotropically conductive film which is a film of a thermosetting resin containing fine particles of a metal having good electrical conductivity.

Figure 17:
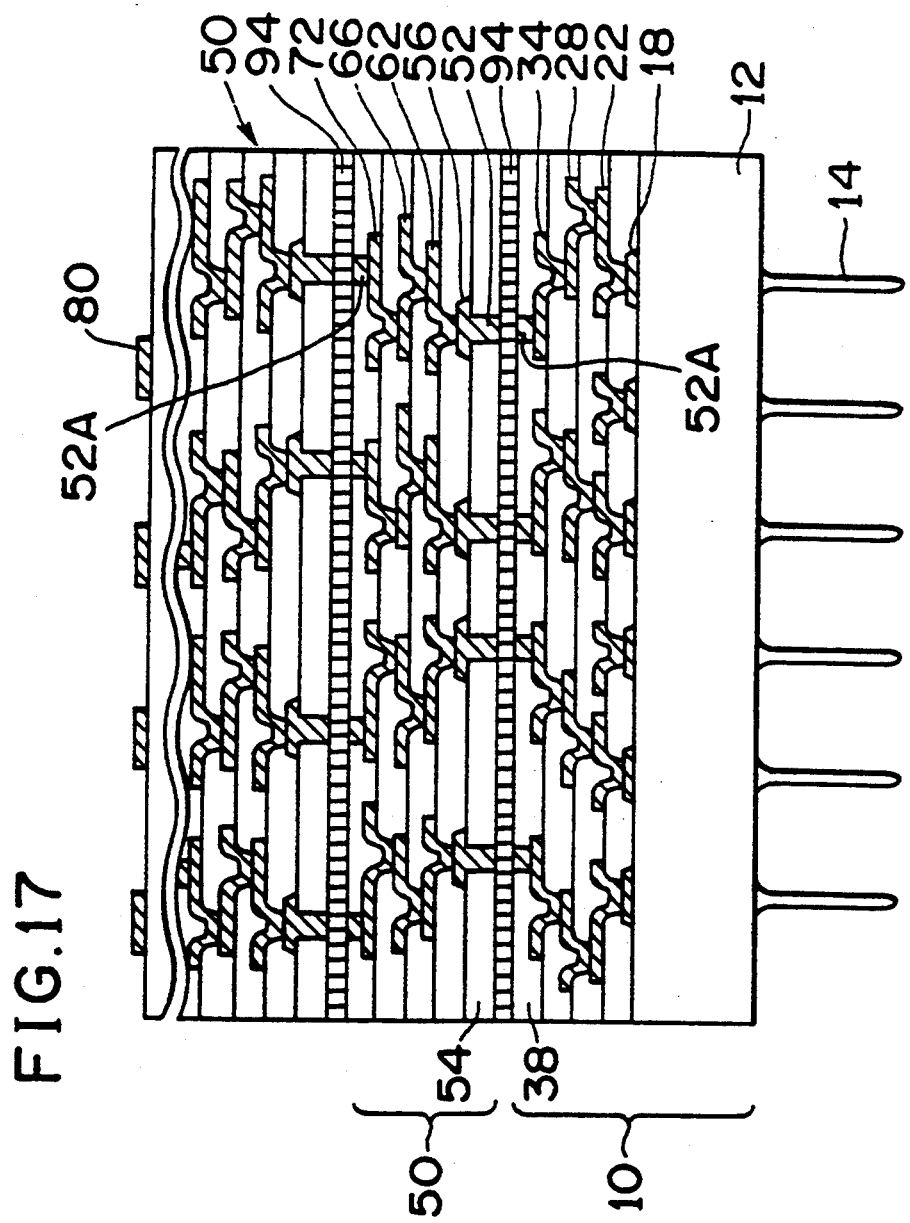
FIG. 17 is a schematic and elevational sectional view of a multilayer wiring board which is another embodiment of the invention and uses an anisotropically conductive film for bonding two blocks to each other.

FIG. 17 shows a multilayer wiring board in which an anisotropically conductive film 94 is interposed between two adjacent blocks (10 and 50, 50 and 50). The base block 10 has a plurality of metal bumps 52A on the top side. Each of the blocks 50 has a plurality of metal bumps 52 on the bottom side and a plurality of metal bumps 52A on the top side. In this multilayer board each block is mechanically bonded to the adjacent block(s) by the adhesive power of the anisotropically conductive film 94. In the bonding operation the film 94 is strongly compressed in each area between any of the metal bumps 52 and the opposite metal bump 52A so that in the film 94 in that area the conductive metal particles are squashed and forced to make very good contact with each other. Therefore, the film 94 becomes a good conductor in the area between each metal bump 52 and the opposite metal bump 52A. In the remaining areas the metal particles in the film 94 do not make good contact with other, so that the film 94 is not conductive widthways.

For example, the anisotropically conductive film 94 has a thicknesses of 20–30 $\mu m$ and contains 5–20 vol % of conductive metal particles which are 5–25 $\mu m$ in particle diameter. An example of commercially available anisotropically conductive films is SUMIZAC 1003 of Sumitomo Bakelite Co.

EXAMPLE 7

Figure 18A:
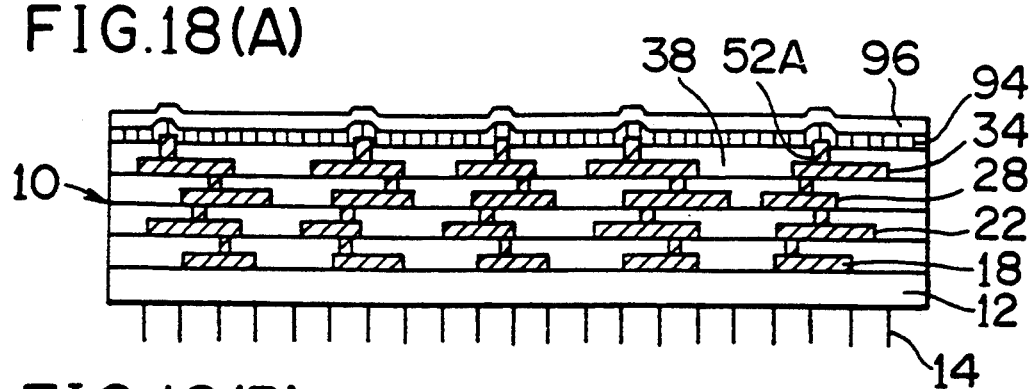
FIGS. 18(A) to 18(C) illustrate a part of the process of assembling the multilayer wiring board of FIG. 17.

Referring to FIG. 18(A), the base block 10 of the multilayer wiring board shown in FIG. 17 is produced by substantially the same process as in Example 2. Gold is used as the wiring metal, and the bumps 52A on the top polyimide layer 38 is formed by multilayer plating of nickel and gold. An anisotropically conductive film 94 containing fine particles of gold-tin alloy is cut into a piece in conformity with the surface area of the block 10, and one side of the film 94 is laminated with a carrier film 96 which is a polyester film having a thickness of 50–100 $\mu m$. Together with the carrier film 96 the anisotropically conductive film 94 is placed on the top surface of the block 10 and provisionally bonded to the block 10 by applying a compressive pressure of 3–5 kg/cm$^2$ for 2–3 sec at a temperature of about 135° C. under reduced pressure of 10 Torr or below by using a vacuum hydraulic press.

Figure 18B:
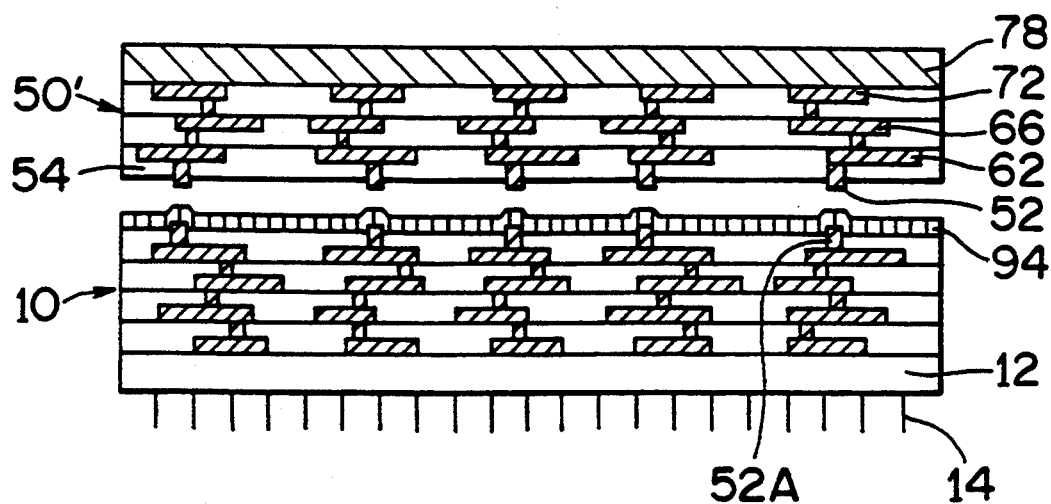

Referring to FIG. 18(B), the carrier film 96 is removed from the anisotropically conductive film 94 on the base block 10. Then a temporary block 50′ having metal bumps 52 is placed on the base plate 10 covered with the film 94 so as to align the bumps 52 of the block 50′ with the bumps 52A of the base block 10, respectively. The temporary block 50′ is produced by the same process as in Example 1. The bumps 52 are formed by multilayer plating of nickel and gold. Then the block 50′ is bonded to the block 10 by applying a compressive pressure of 30–40 kg/cm$^2$ at a temperature of 150°–160° C. for 20–30 sec under reduced pressure of 10 Torr or below by using the vacuum hydraulic press. After that the aluminum plate 78 of the temporary block 50′ is removed in the same manner as in the foregoing examples. Then, substantially in the same manner as in Example 2 the exposed top surface of the block 50 (formerly temporary block 50′) is overlaid with a polyimide layer having a plurality of via holes, and new metal bumps (gold and nickel multilayer plating) are formed by using these via holes.

Figure 18C:
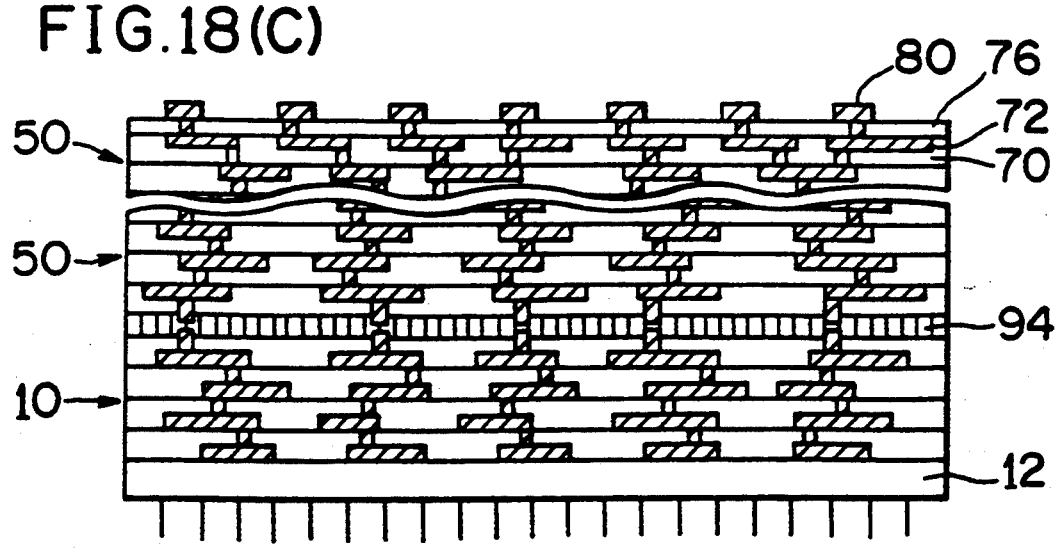

Referring to FIG. 18(C), as the result of the heat pressing operation the block 50 (formerly temporary block 50′) is firmly bonded to the base block 10 with the anisotropically conductive film 94, and the film 94 provides good electrical connection between each metal bump 52 of the block 50 and the opposite metal bump 52A of the base block 10. Widthways the resistivity of the film 94 is still above 10$^9$ ohms, so that any metal bump 52, 52A of either block 10, 50 is not short-circuited with another bump of the same block. The bonding operation described with reference to FIG. 18(B) is repeated until an intended number of blocks are assembled into the multilayer wiring board, and finally the terminal pads 80 are formed.

EXAMPLE 8

This example relates to a minor modification of Example 6 mainly in respect of the particulars of the electrical joints between two adjacent blocks.

Figure 19A:
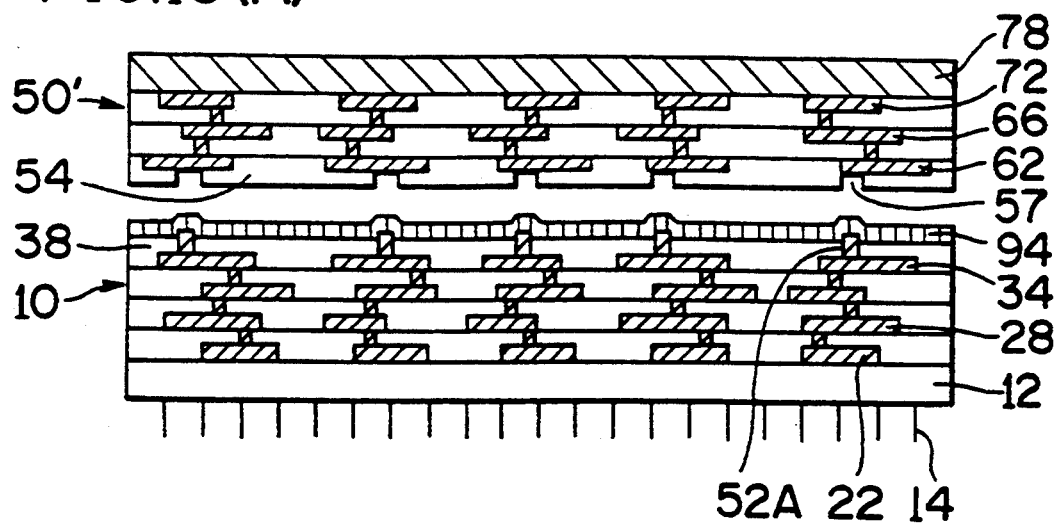
FIGS. 19(A) and 19(B) illustrate a partial modification of the process illustrated in FIGS. 18(A) and 18(B)

Referring to FIG. 19(A), the base block 10 is similar to that in Example 7 except that each wiring layer is formed by copper plating which is overlaid with nickel plating in the same manner as in Example 2 and that the metal bumps 52A are formed by electroplating of copper to a thickness of 60 $\mu m$. In this example the anisotropically conductive film 94 contains fine particles of indium-lead alloy.

The temporary block 50′ is produced by substantially the same process as in Example 2. The wiring layers are formed by copper plating which is overlaid with nickel plating. In this example, the temporary block 50′ is not provided with metal bumps. That is, the via holes 57 in the polyimide surface layer 54 are left open to locally expose the wiring layer 62 in areas corresponding to the metal bumps 52A of the base block 10. Each via hole 57 has an area in conformity with the cross-sectional area of each bump 52A of the block 10. After provisionally bonding the anisotropic conductive film 94 to the base block 10 the temporary block 50′ is bonded to the base block 10 by the same heat pressing operation as in Example 7.

Figure 19B:
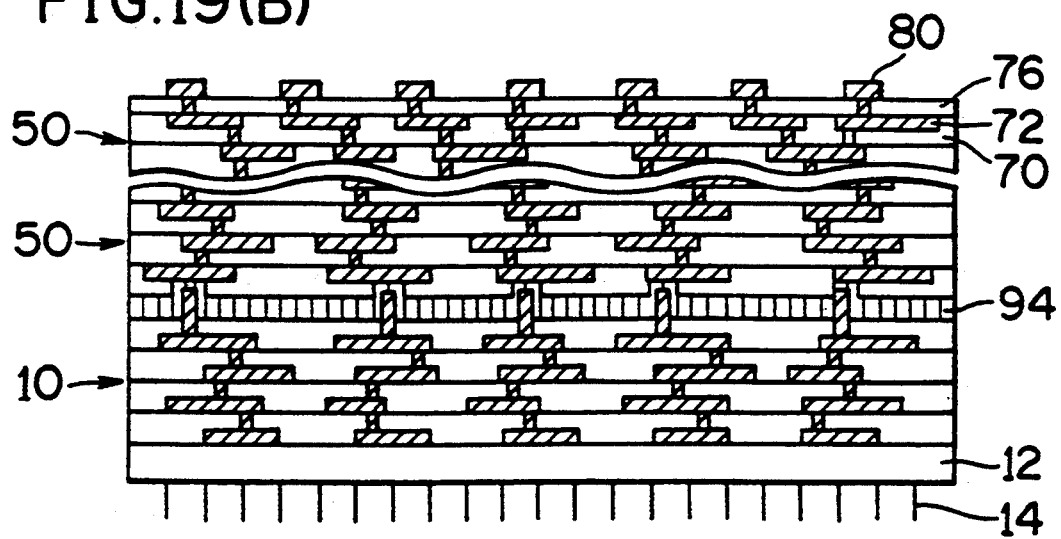

Referring to FIG. 19(B), as the result of the heat pressing operation each of the metal bumps 52A of the base block 10 squeezes the anisotropically conductive film 94 and intrudes into the opposite via hole 57 of the block 50. Therefore, in each via hole 57 the conductive alloy particles in the film 94 are squashed to make good contact with each other, so that good electrical connection is established between each bump 52A of the block 10 and the wiring layer 62 of the adjacent block 50'.

In this invention each of the temporary blocks 50' has a temporary substrate, viz. the aluminum plate 78 used in the foregoing example, and the temporary substrate has to be removed in the course of assembling the blocks into a multilayer wiring board. In the foregoing examples the temporary substrate 78 of aluminum is removed by an acid treatment. However, there is a possibility that the wiring layers in the semiprocessed wiring board is influenced by the acid solution or an alternative liquid used to dissolve the temporary substrate. This problem can be solved by the following technique.

For each of the temporary blocks 50' a substrate having a surface area slightly larger than the surface area of the aimed block 50 is used. By using an auxiliary means, the wiring layers and polyimide insulation layers of the temporary block 50' are formed on the temporary substrate such that only a peripheral region of the temporary substrate strongly adheres to the bottom of the multilayer structure of the wiring and insulating layers. That is, in the remaining major area the temporary substrate does not adhere to the multilayer structure or only very weakly adheres to the multilayer structure. After bonding the temporary block to the base block 10 or an assembly of precedingly bonded blocks, the peripheral region of the temporary substrate is cut away by machining together with the auxiliary means, and thereafter the remaining major portion of the temporary substrate is peeled away from the bottom layer of the multilayer structure of the temporary block. The material of the temporary substrate is, for example, aluminum, silicon or alumina. The following examples illustrate the details of this technique.

EXAMPLE 9

Figure 20A:
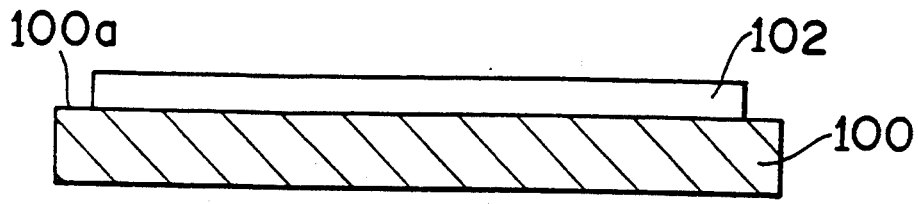
FIGS. 20(A) to 20(G) illustrate a process of making a temporary block having a detachable temporary substrate.
Figure 20B:
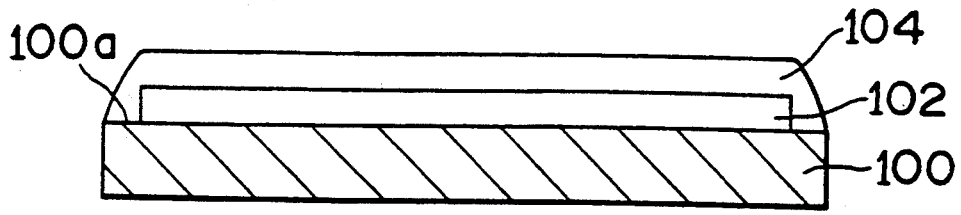
Figure 20C:
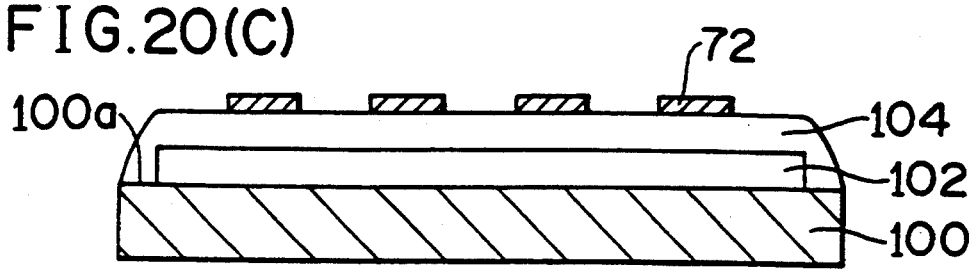
Figure 20D:
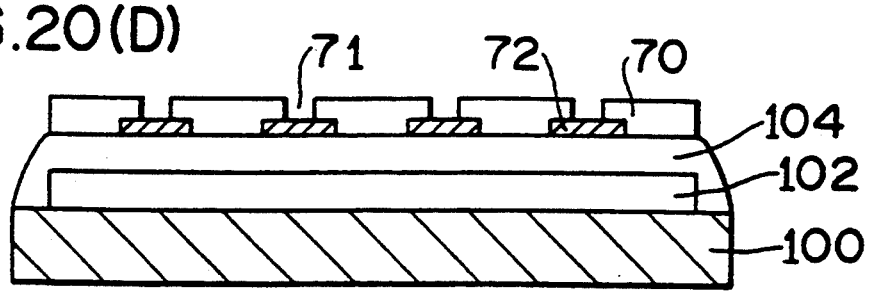
Figure 20E:
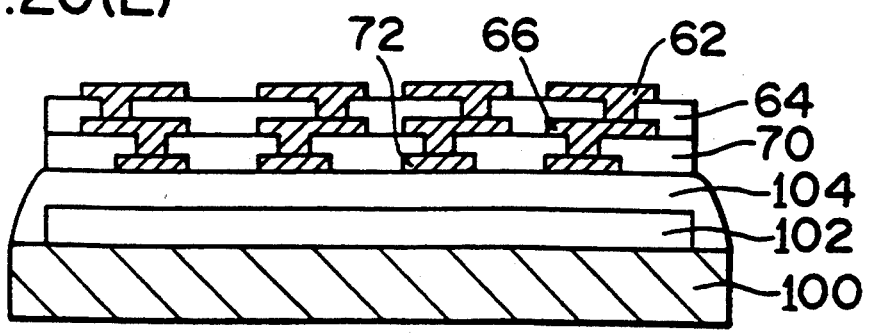
Figure 20F:
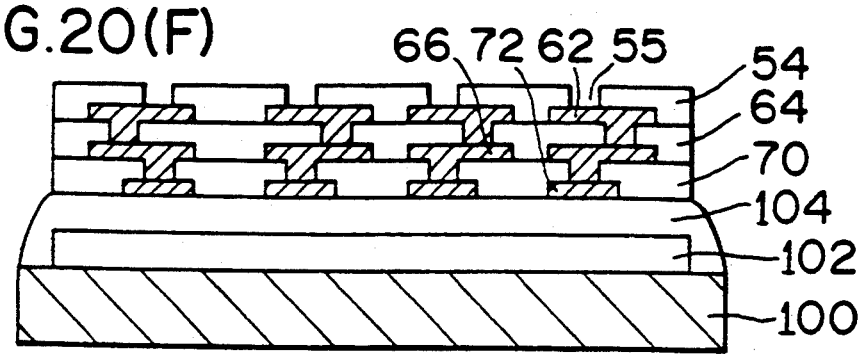
Figure 20G:
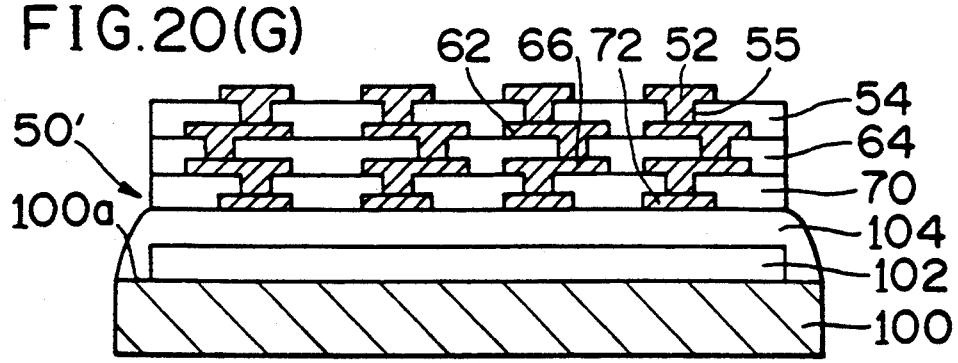

FIGS. 20(A) to 20(G) illustrate a process of producing a temporary block 50' using a flat plate 100 of aluminum as the temporary substrate. The aluminum plate 100 has a surface area slightly larger than the surface area of the principal part of the block 50'. Referring to FIG. 20(A), a polyimide layer 102 is formed on one side of the aluminum substrate 100 so as to leave a peripheral region 100a of the substrate 100 exposed. The surface area of the polyimide layer 102 conforms with the surface area of the principal part of the block 50'. The polyimide is low in thermal expansion coefficient and does not have a glass transition temperature, and this polyimide adheres to the aluminum substrate fairly strongly. Using the same polyimide, another polyimide layer 104 shown in FIG. 20(B) is formed so as to entirely cover the polyimide layer 102 and also the peripheral region 100a of the aluminum substrate 100. Next, as shown in FIG. 20(C), a grounding and interconnecting wiring layer 72 is formed on the polyimide layer 104 by gold plating. After that, as shown in FIGS. 20(D) to 20(F), polyimide layers 70, 64, 54 and wiring layers 66, 62 are alternately formed by the already described process by using gold as the wiring metal and a photosensitive polyimide having a glass transition temperature as the insulator material. At the final step shown in FIG. 20(G), gold bumps 52 are formed on the top polyimide layer 54 by using the via holes 55 in this layer 54.

Figure 21:
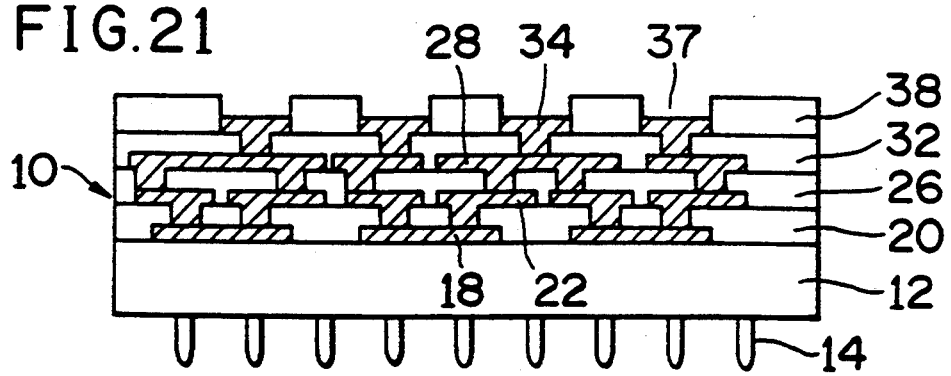
FIG. 21 shows a base block.

FIG. 21 shows a base block 10 which is produced by the already described process by using gold as the wiring metal and a photosensitive polyimide having a glass transition temperature as the insulator material. The top polyimide layer 38 has via holes 37, and in each of these via holes 37 the wiring layer 34 is exposed in the shape of a bump.

Figure 22A:
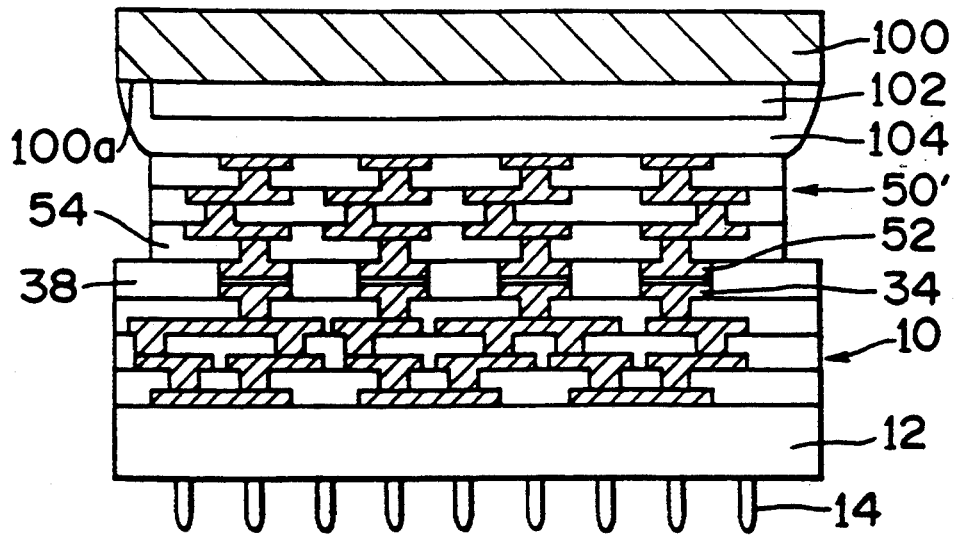
FIGS. 22(A) to 22(H) illustrate a process of assembling a multilayer wiring board by using the base block of FIG. 21 and a plurality of temporary blocks obtained by the process illustrated in FIGS. 20(A) to 20(D)
Figure 22B:
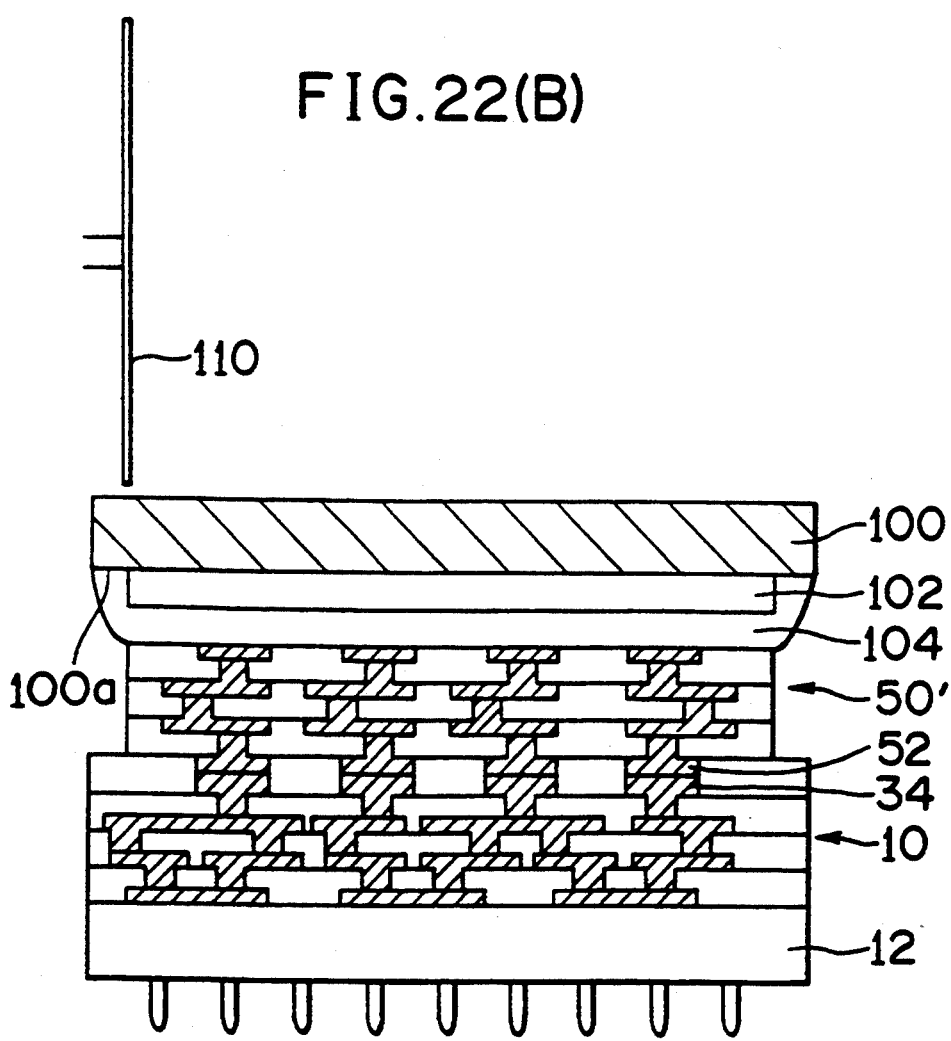
Figure 22C:
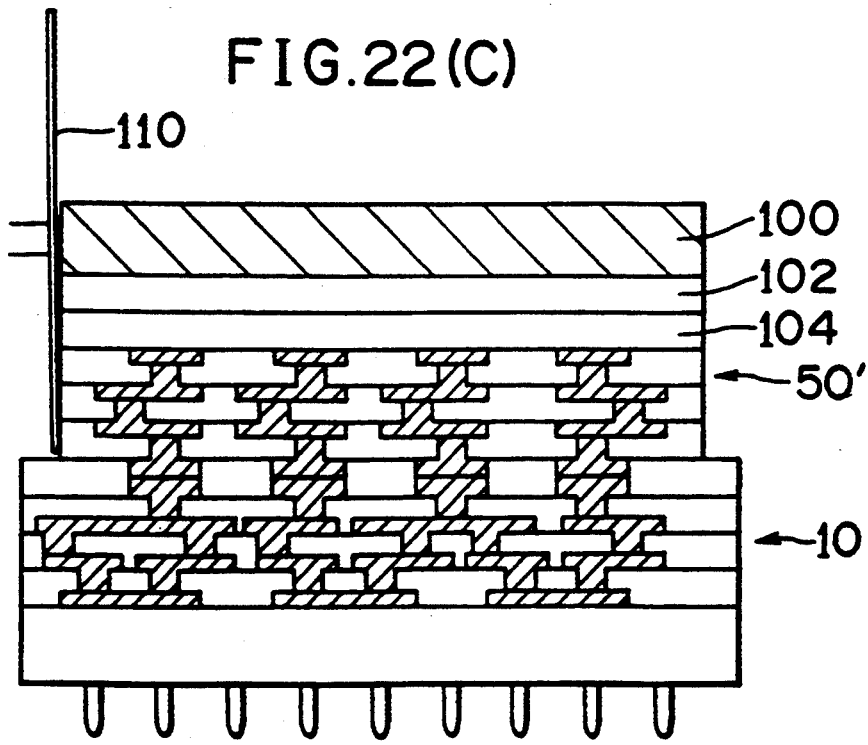
Figure 22D:
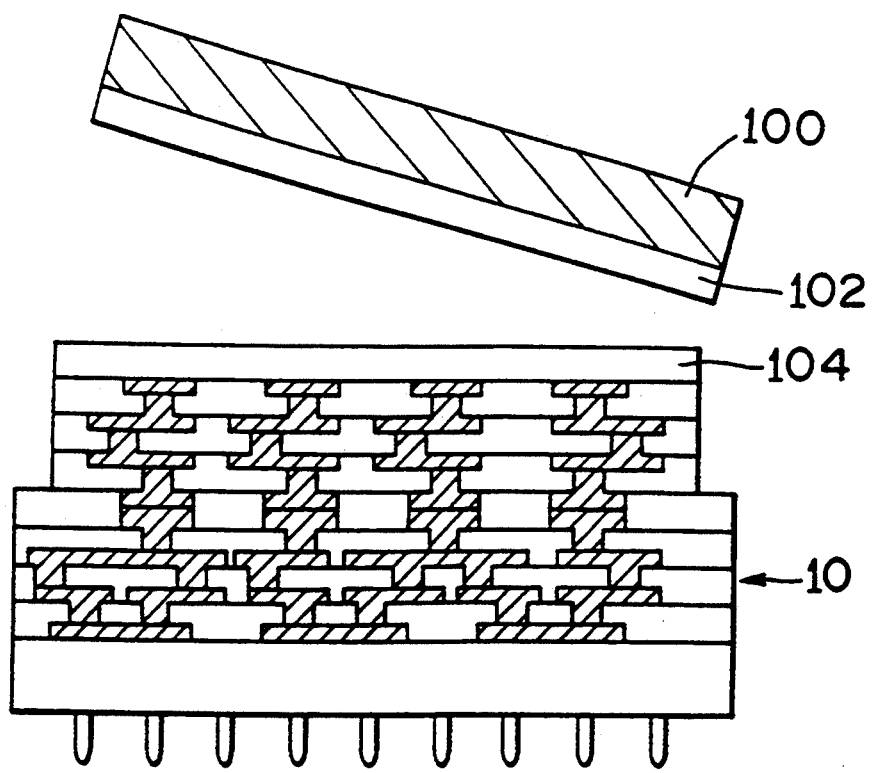
Figure 22E:
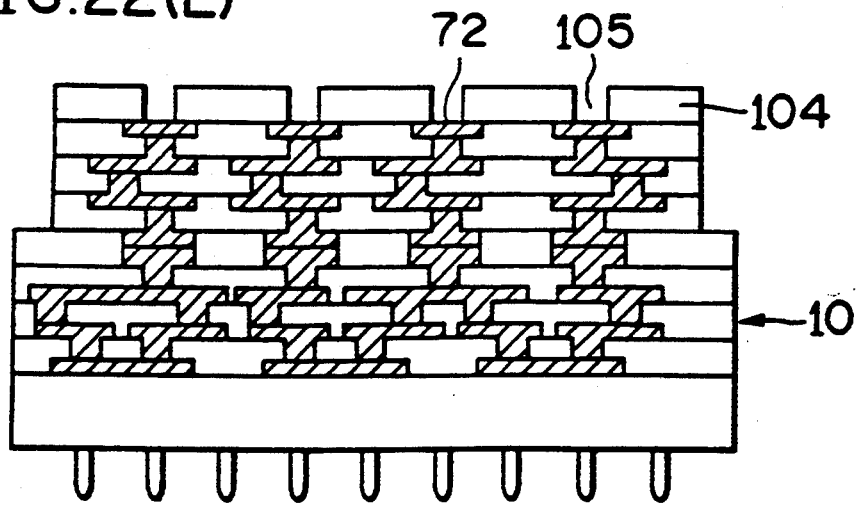
Figure 22F:
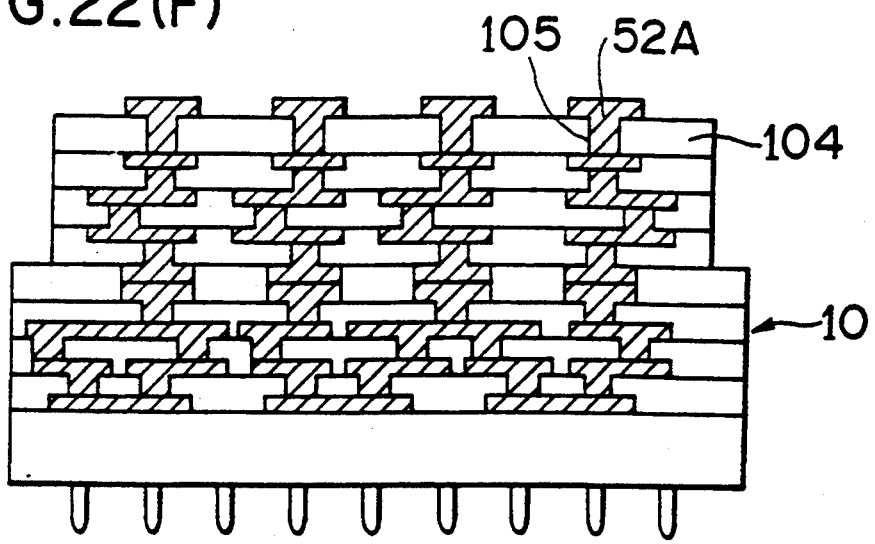
Figure 22G:
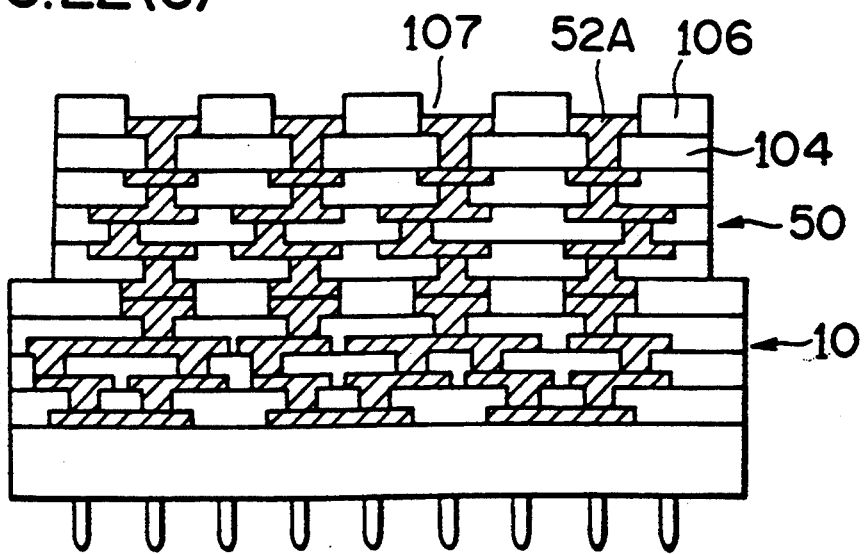
Figure 22H:
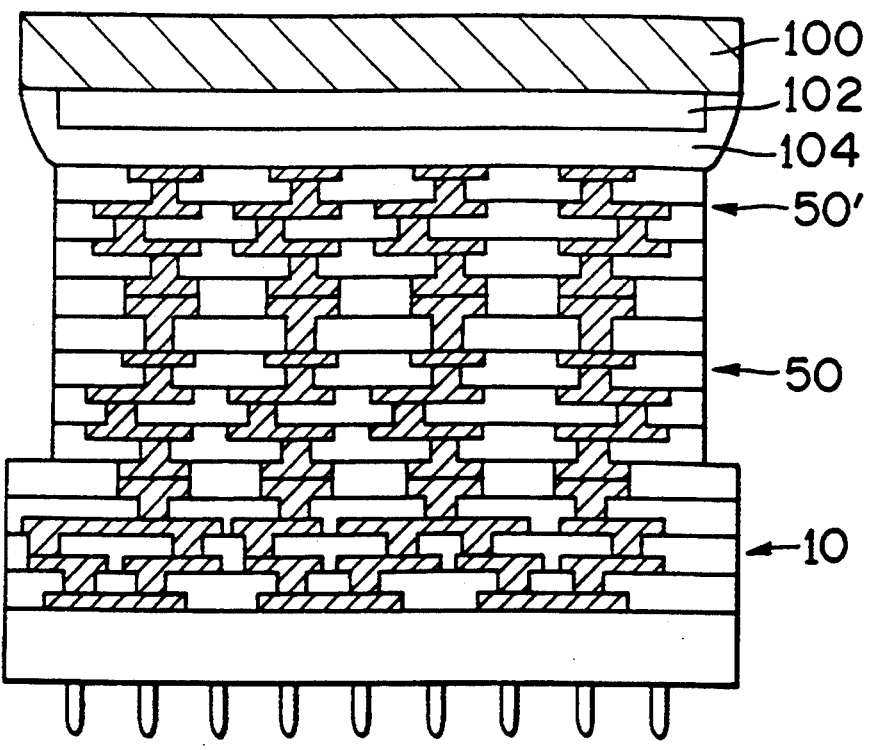
Figure 23A:
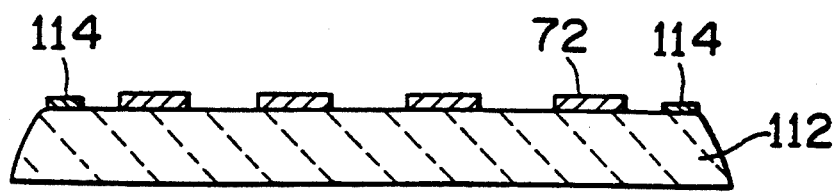
FIGS. 23(A) to 23(E) illustrate a process of making another temporary block having a detachable temporary substrate.
Figure 23B:
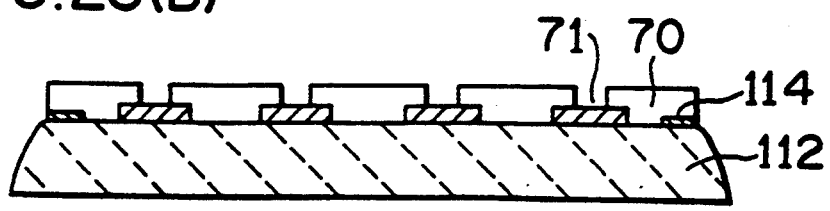
Figure 23C:
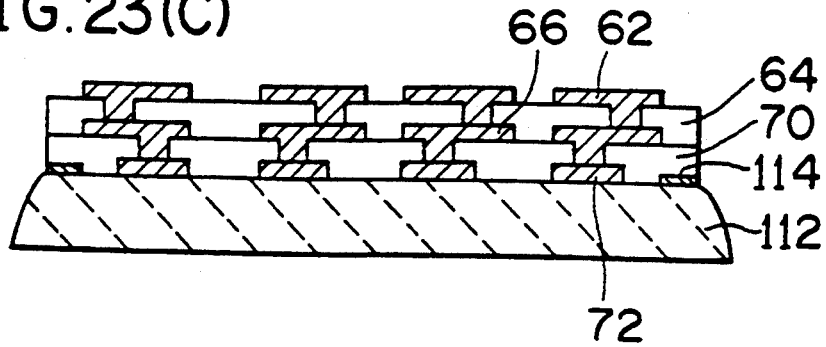
Figure 23D:
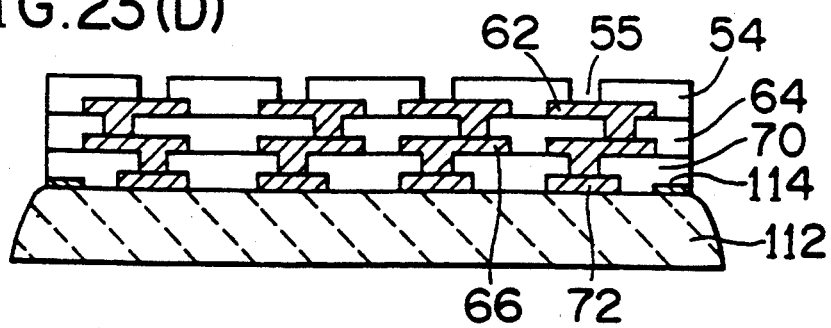
Figure 23E:
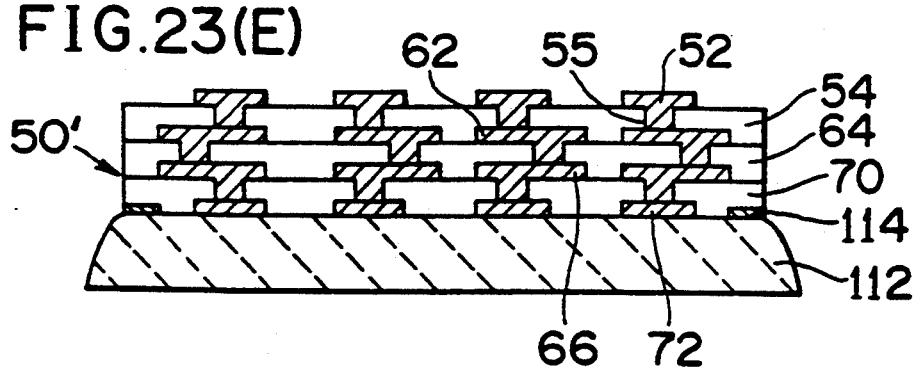

FIGS. 22(A) to 22(H) illustrate the subsequent assembling operations. As shown in FIG. 22(A) the temporary block 50' is placed on the base block 10 and bonded to the base block 50' by the heat pressing operation described in Example 1. Next, as shown in FIGS. 22(B) and 22(C), with a dicing saw 110 the peripheral region 100a of the temporary substrate 100 is cut away together with the peripheral region of the polyimide layer 104. Referring to FIG. 22(D), the polyimide layer 102 makes good adhesion to the aluminum substrate 100 but does not well adhere to the polyimide layer 104. Therefore, the lamination of the aluminum substrate 100 and the polyimide layer 102 can easily be peeled away from the polyimide layer 104. After removing the aluminum substrate 100 together with the polyimide layer 102, via holes 105 shown in FIG. 22(E) are formed in the exposed polyimide layer 104 by a dry etching process, and gold bumps 52A shown in FIG. 22(F) are formed by using the via holes 105. Next, as shown in FIG. 22(G), another polyimide layer 106 having via holes 107 are formed such that the gold bumps 52A are exposed in the respective via holes 107. After that another temporary block 50' is bonded to the assembly of FIG. 22(G), and the temporary substrate 100 of this block 50' is removed by the above described technique.

EXAMPLE 10

Referring to FIGS. 23(A) to 23(E), a flat plate 112 of sapphire (alumina) is used as the temporary substrate, and a grounding and interconnecting wiring layer 72 is formed on the sapphire substrate 112 by copper plating. Besides, a metal film 114 is formed on a peripheral region of the substrate 112 by a PVD process. For example, the metal is selected from Ti, Cr, W, Pt and Pd. Then a polyimide layer 70 is formed on the wiring layer 72 so as to cover the metal film 114 too, and via holes 71 are formed in the polyimide layer. A photosensitive polyimide not having a glass transition temperature is used. After that the already described operations are performed to obtain a temporary block 50' shown in FIG. 23(E). In this block 50' the surface of the polyimide layers 70, 64, 54 is slightly larger than the specified pattern area and conforms with the surface area of the temporary substrate 112. The top polyimide layer 54 uses a photosensitive polyimide having a glass transition temperature.

Figure 24A:
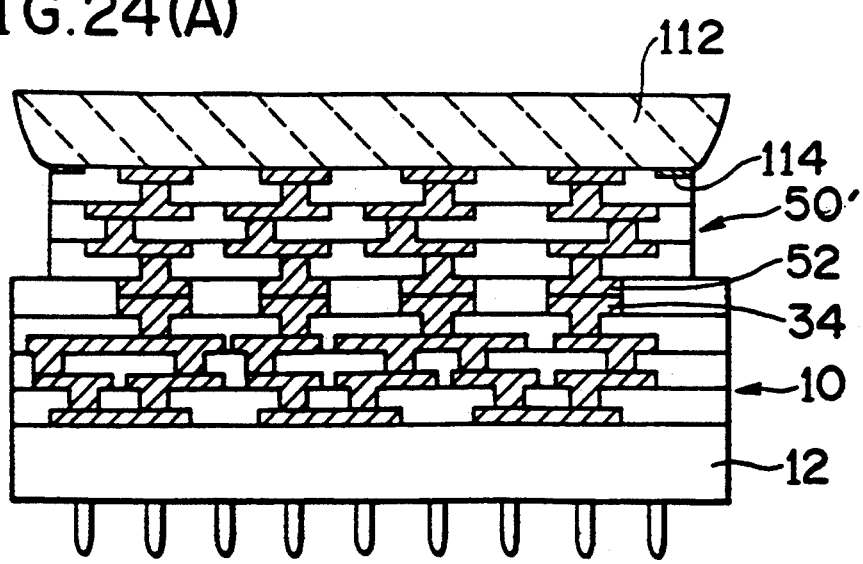
FIGS. 24(A) to 24(D) illustrate a process of bonding the temporary block obtained by the process illustrated in FIGS. 23(A) to 23(E) to a base block and then detaching the temporary substrate.
Figure 24B:
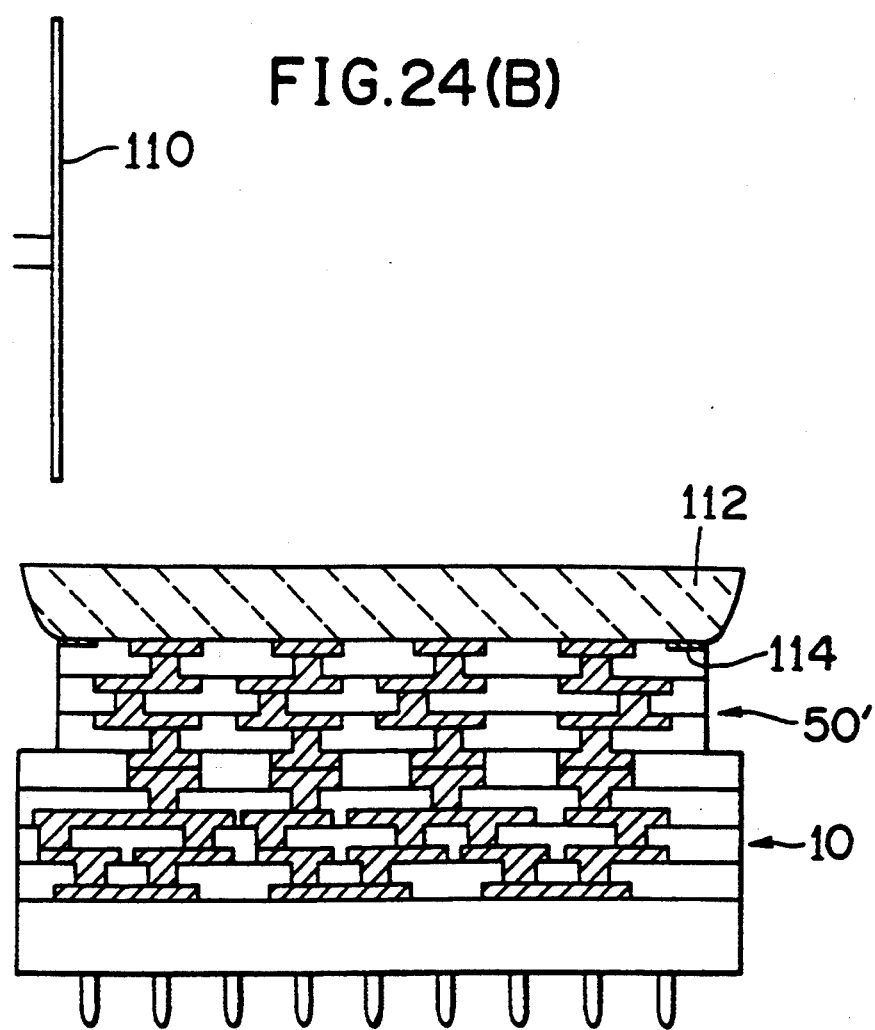
Figure 24C:
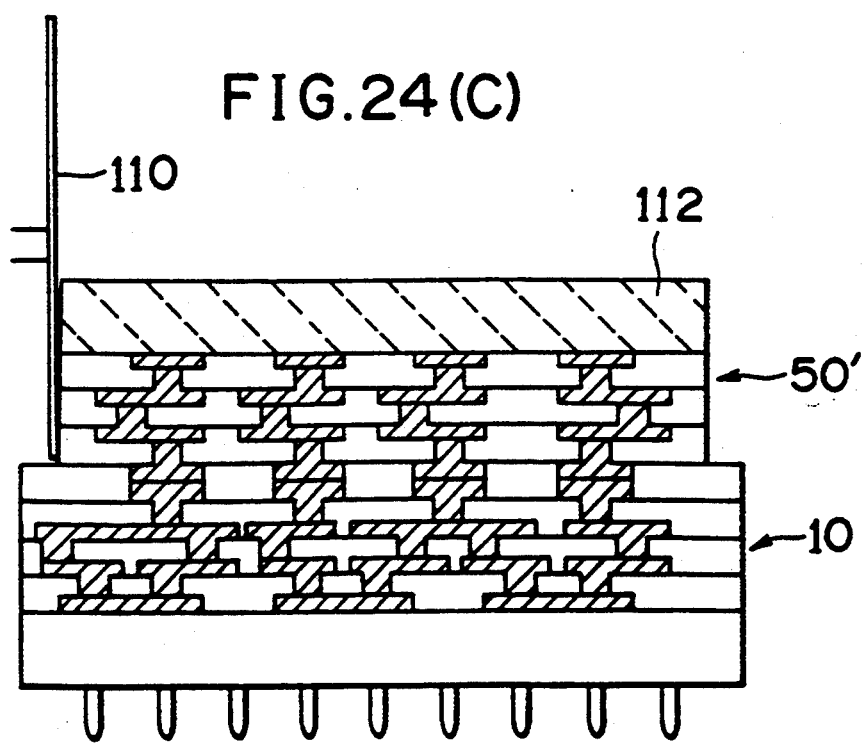
Figure 24D:
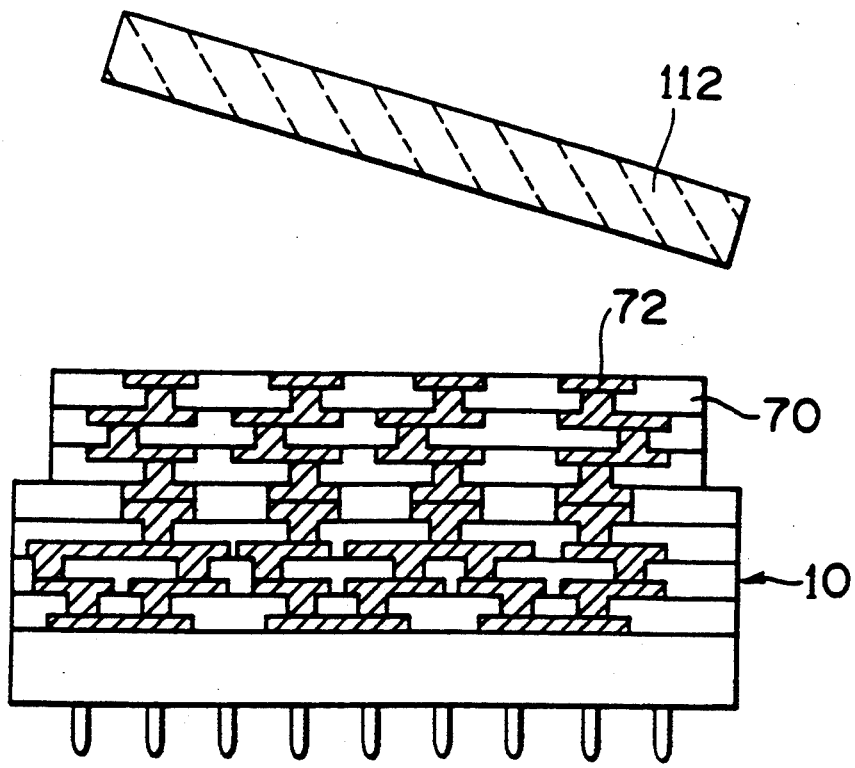

Referring to FIG. 24(A), the temporary block 50' is bonded to a base block 10 by the heat pressing operation described in Example 1. The base block 10 is produced by the already described process using copper as the wiring metal and a photosensitive polyimide having a glass transition temperature as the material of the top layer 38. After that, as shown in FIGS. 24(B) and 24(C), the peripheral region of the sapphire substrate 112 is cut away by the dicing saw 110 together with the metal film 114 and a peripheral region of the polyimide layers of the block 50'. Referring to FIG. 24(D), after the removal of the metal film 114 the sapphire substrate 112 can easily be peeled away since the substrate does not strongly adhere to the contacting polyimide layer 70 and wiring layer 72.

EXAMPLE 11

Figure 25A:
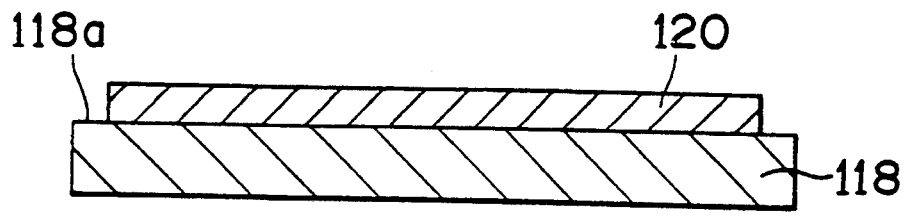
FIGS. 25(A) to 25(C) illustrate a part of a process of making another temporary block having a detachable temporary substrate.
Figure 25B:
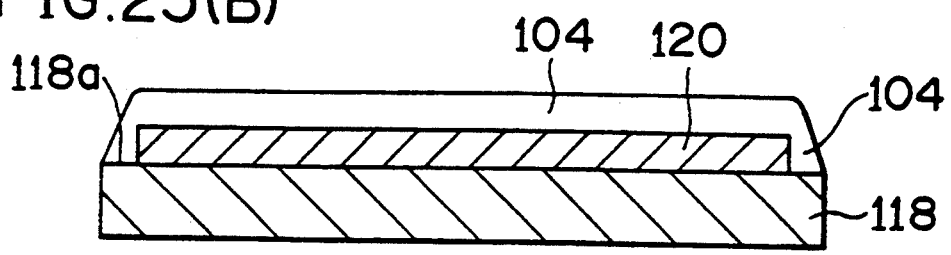
Figure 25C:
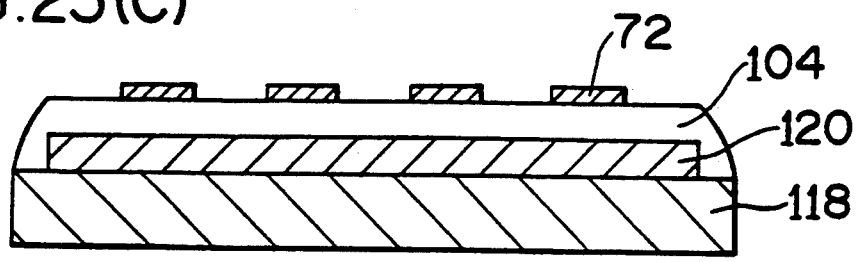
Figure 26:
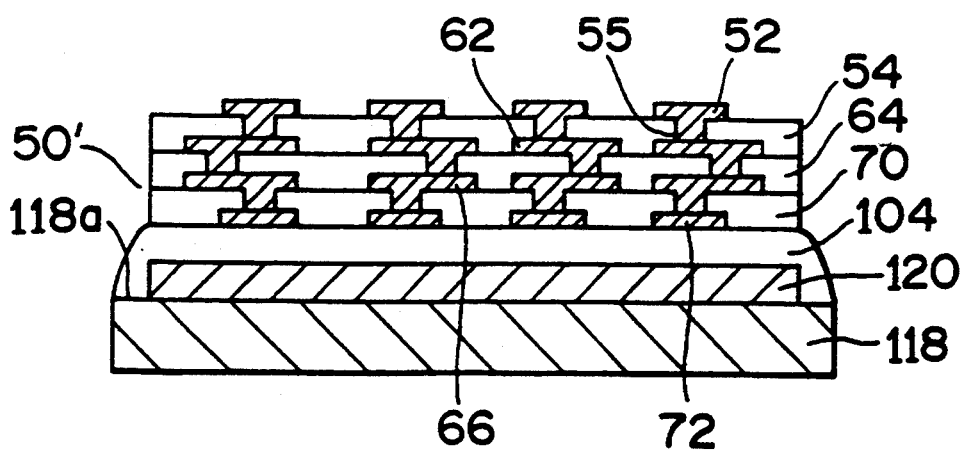
FIG. 26 shows the obtained temporary block.

Referring to FIGS. 25(A) to 25(C), a flat plate 118 of silicon is used as the temporary substrate, and a nickel layer 120 having a thickness of 1-2 μm is formed on the silicon substrate 118 by electroless plating. The surface area of the nickel layer 120 conforms with the surface area of the principal part of the block 50′, and a peripheral region 118a of the silicon substrate 112 is left exposed. Then a polyimide layer 104 is formed so as to entirely cover the nickel layer 120 and the peripheral region 118a of the silicon substrate. The polyimide has a glass transition temperature. Then a grounding and interconnecting wiring layer 72 is formed on the polyimide layer 104 by gold plating. After that the already described operations are performed to obtain a temporary block 50′ shown in FIG. 26.

Figure 27A:
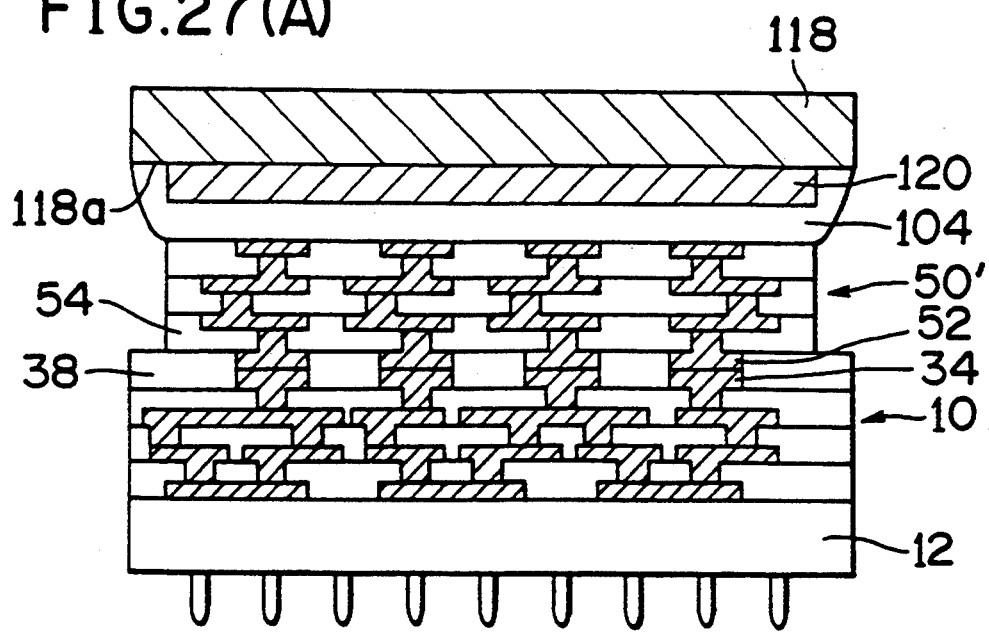
FIGS. 27(A) to 27(C) illustrate a process of bonding the temporary block of FIG. 26 to a base block and then detaching the temporary substrate.
Figure 27B:
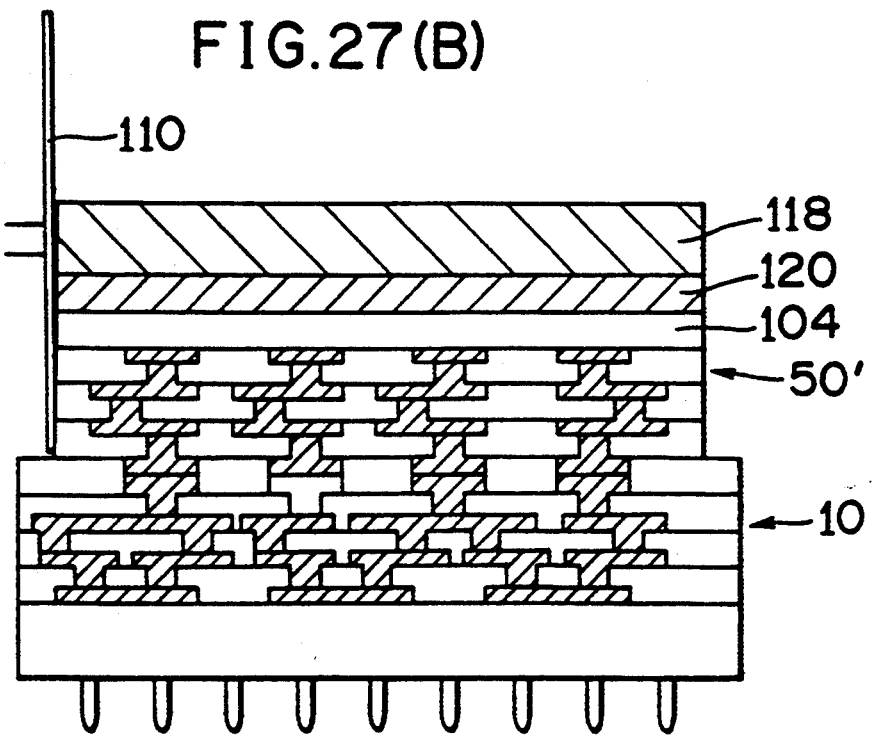
Figure 27C:
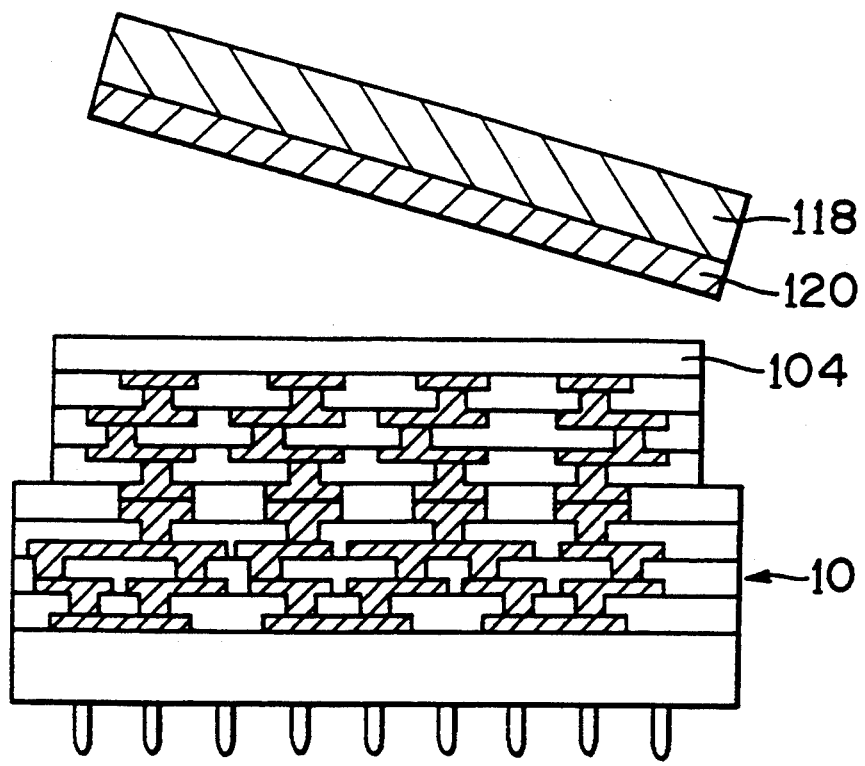

Referring to FIG. 27(A), the temporary block 50′ is bonded to a base block 10 by the heat pressing operation described in Example 1. In the base block 10 gold is used as the wiring metal and a photosensitive polyimide having a glass transition temperature as the insulator material. Referring to FIG. 27(B), with a dicing saw 110 the peripheral region 118a of the silicon substrate 118 of the block 50′ is cut away together with the peripheral region of the polyimide layer 104. After that, as shown in FIG. 27(C), the silicon substrate 118 can easily be peeled away together with the nickel layer 120 since the nickel layer 120 does not well adhere to the polyimide layer 104.

What is claimed is:

1. A method of producing a multilayer wiring board, comprising the steps of:
   i) making a laminated base block which comprises an electrically insulating substrate, a combination of a plurality of wiring layers and a plurality of polyimide resin layers in an alternately laminated arrangement and a plurality of electrical terminals exposed in the surface opposite from said substrate which is a polyimide resin layer surface;
   ii) separately making a plurality of laminated temporary blocks each of which comprises a temporary substrate, a combination of a plurality of wiring layers and a plurality of polyimide resin layers in an alternately laminated arrangement and a plurality of electrical terminals on the surface opposite from said temporary substrate which is a polyimide resin layer surface;
   iii) bonding one of said temporary blocks to said base block such that said electrical terminals of the temporary block come into alignment with said electrical terminals of the base block, respectively, and electrically connecting said electrical terminals of the temporary block to said electrical terminals of the base block, respectively;
   iv) removing said temporary substrate;
   v) providing a plurality of electrical terminals on the surface exposed by the removal of said temporary substrate which is a polyimide resin layer surface; and
   vi) bonding another temporary block to the laminate obtained by the steps i to v and electrically connecting the electrical terminals of said another temporary block to the electrical terminals provided at the step v; and
   vii) removing the temporary substrate of said another temporary block.

2. A method according to claim 1, wherein one of (A) said electrical terminals in the step i and said electrical terminals in the step v and (B) said electrical terminals in the step ii are solder pools and the other are metal bumps.

3. A method according to claim 2, wherein said solder pools are formed of multilayer plating of a plurality of elemental metals which are the constituents of an alloy solder, said metal bumps comprising at least one of said plurality of elemental metals.

4. A method according to claim 3, wherein said solder pools are formed of multilayer plating of gold and tin, said metal bumps comprising gold plating.

5. A method according to claim 1, wherein one of (A) said electrical terminals in the step i and said electrical terminals in the step v and (B) said electrical terminals in the step ii are conductor pools and the other are metal bumps, said conductor pools being formed of a dispersion of fine particles of a metal in a polyimide resin.

6. A method according to claim 5, wherein said metal in said conductor pools is selected from the group consisting of gold, silver, copper, palladium and silver-palladium alloy.

7. A method according to claim 1, wherein said electrical terminals of said base block and said electrical terminals of each temporary block are all metal bumps.

8. A method according to claim 7, wherein either of said electrical terminals in the step ii and said electrical terminals in the step v are solder bumps.

9. A method according to claim 1, wherein at least one of (A) said electrical terminals in the step i and said electrical terminals in the step v and (B) said electrical terminals in the step ii are metal bumps, both the step iii and the step vi comprising interposing an anisotropically conductive film, which is a resin film comprising fine particles of a metal, between the two blocks to be bonded to each other such that the anisotropically conductive film is squeezed by said metal bumps of one of the two blocks against the electrical terminals of the other block.

10. A method according to claim 1, wherein said surface of each temporary block in the step ii is formed of a polyimide resin which has a glass transition temperature and serves as an adhesive when heated to a temperature above the glass transition temperature.

11. A method according to claim 1, wherein both the step iii and the step vi comprise interposing a thermosetting adhesive resin between the two blocks to be bonded to each other.

12. A method according to claim 11, wherein said thermosetting adhesive resin is a maleimide resin.

13. A method according to claim 1, wherein both the step iii and the step vi comprise interposing a thermoplastic adhesive resin between the two blocks to be bonded to each other.

14. A method according to claim 13, wherein said thermoplastic adhesive resin is a copolymer of tetrafluoroethylene and a perfluoroalkylvinyl ether.

15. A method according to claim 1, wherein said temporary substrate is made of aluminum, both the step iv and the step vii comprising dissolving the temporary substrate in an acid solution.

16. A method according to claim 1, wherein said temporary substrate is made larger in surface area than said wiring layers in each temporary block, the step ii comprising the sub-steps of bonding only a peripheral region of the temporary substrate to the bottom layer of said combination with a polyimide resin and providing the temporary substrate with an adhesion restricting means for preventing the remaining major region of the temporary substrate from firmly adhering to said bottom layer, both the step iv and the step vii comprising the sub-steps of cutting away said peripheral region of the temporary substrate together with the polyimide resin adhering to said peripheral region and peeling the remaining major region of the temporary substrate.

17. A method according to claim 16, wherein said adhesion restricting means comprises a first polyimide layer of a polyimide resin not having a glass transition temperature formed on the temporary substrate so as to leave only said peripheral region exposed and a second polyimide layer of a polyimide resin not having a glass transition temperature formed on said first polyimide layer so as to cover the entire region of the temporary substrate inclusive of said peripheral region.

18. A method according to claim 17, wherein the material of said temporary substrate is selected from the group consisting of aluminum, silicon and alumina.

19. A method according to claim 16, wherein said temporary substrate is an alumina substrate, said adhesion restricting means comprising a thin film of a metal selected from the group consisting of titanium, chromium, tungsten, platinum and palladium deposited on only said peripheral region of the temporary substrate.

20. A method according to claim 16, wherein the material of said temporary substrate is selected from the group consisting of aluminum, silicon and alumina, said adhesion restricting means comprises a nickel plating layer formed on the temporary substrate so as to leave only said peripheral region exposed and a polyimide layer of a polyimide resin having a glass transition temperature formed on said nickel plating layer so as to cover the entire region of the temporary substrate inclusive of said peripheral region.

* * * * *

UNITED STATES PATENT AND TRADEMARK OFFICE
CERTIFICATE OF CORRECTION

PATENT NO. : 5,426,849
DATED : June 27, 1995
INVENTOR(S) : Koji Kimbara

It is certified that error appears in the above-indentified patent and that said Letters Patent is hereby corrected as shown below:

Col. 7, line 38, delete "lo"

Signed and Sealed this

Seventeenth Day of October, 1995

Attest:

BRUCE LEHMAN

Attesting Officer

Commissioner of Patents and Trademarks